United States Patent
Kawakami et al.

(10) Patent No.: US 9,536,942 B2
(45) Date of Patent: Jan. 3, 2017

(54) SEMICONDUCTOR DEVICE HAVING A PLURALITY OF ELECTRIC FIELD RELAXATION LAYERS AND METHOD FOR MANUFACTURING SAME

(75) Inventors: Tsuyoshi Kawakami, Tokyo (JP); Kenji Hamada, Tokyo (JP); Kohei Ebihara, Tokyo (JP); Akihiko Furukawa, Tokyo (JP); Yuji Murakami, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 79 days.

(21) Appl. No.: 14/363,914

(22) PCT Filed: Aug. 2, 2012

(86) PCT No.: PCT/JP2012/069700
§ 371 (c)(1),
(2), (4) Date: Jun. 9, 2014

(87) PCT Pub. No.: WO2013/136550
PCT Pub. Date: Sep. 19, 2013

(65) Prior Publication Data
US 2014/0353678 A1    Dec. 4, 2014

(30) Foreign Application Priority Data

Mar. 15, 2012 (JP) ................................. 2012-059899

(51) Int. Cl.
*H01L 21/266* (2006.01)
*H01L 29/78* (2006.01)
(Continued)

(52) U.S. Cl.
CPC ........... *H01L 29/063* (2013.01); *H01L 21/266* (2013.01); *H01L 29/0615* (2013.01);
(Continued)

(58) Field of Classification Search
CPC ............. H01L 29/0619; H01L 29/0623; H01L 29/0611–29/0634
See application file for complete search history.

(56) References Cited

U.S. PATENT DOCUMENTS 4,573,066 A * 2/1986 Whight ............... H01L 29/0619
257/495
4,672,738 A    6/1987 Stengl et al.
(Continued)

FOREIGN PATENT DOCUMENTS

JP    6-3799    1/1994
JP    9-64342    3/1997
(Continued)

OTHER PUBLICATIONS

Written Opinion issued Oct. 30, 2012 in PCT/JP2012/069700 filed on Aug. 2, 2012 (English translation).
(Continued)

*Primary Examiner* — Eric Ward
(74) *Attorney, Agent, or Firm* — Oblon, McClelland, Maier & Neustadt, L.L.P.

(57) ABSTRACT

A semiconductor device includes an active region formed in an upper layer portion of a semiconductor layer of a first conductivity type, and a plurality of electric field relaxation layers disposed from an edge of the active region toward the outside so as to surround the active region. The plurality of electric field relaxation layers include a plurality of first electric field relaxation layers and a plurality of second electric field relaxation layers alternately disposed adjacent to each other, the first electric field relaxation layer and the second electric field relaxation layer adjacent to each other forming a set. Impurities of a second conductivity type are implanted to the first electric field relaxation layers at a first surface density, widths of which becoming smaller as apart from the active region. Impurities of the second conductivity
(Continued)

type are implanted to the second electric field relaxation layers at a second surface density lower than the first surface density, widths of which becoming larger as apart from the active region.

10 Claims, 23 Drawing Sheets

(51) Int. Cl.
| | |
|---|---|
| H01L 29/872 | (2006.01) |
| H01L 29/06 | (2006.01) |
| H01L 29/861 | (2006.01) |
| H01L 29/66 | (2006.01) |
| H01L 29/08 | (2006.01) |
| H01L 29/16 | (2006.01) |
| H01L 29/423 | (2006.01) |

(52) U.S. Cl.
CPC ...... *H01L 29/0619* (2013.01); *H01L 29/0847* (2013.01); *H01L 29/66136* (2013.01); *H01L 29/66143* (2013.01); *H01L 29/66659* (2013.01); *H01L 29/7835* (2013.01); *H01L 29/8611* (2013.01); *H01L 29/872* (2013.01); H01L 29/0638 (2013.01); H01L 29/0692 (2013.01); H01L 29/1608 (2013.01); H01L 29/42368 (2013.01)

(56) References Cited

U.S. PATENT DOCUMENTS

| | | | |
|---|---|---|---|
| 5,804,864 A | 9/1998 | Akiyama | |
| 5,994,189 A | 11/1999 | Akiyama | |
| 6,002,159 A | 12/1999 | Bakowski et al. | |
| 6,040,237 A | 3/2000 | Bakowski et al. | |
| 6,469,359 B2* | 10/2002 | Bakowski | H01L 29/66068 257/487 |
| 6,831,345 B2 | 12/2004 | Kinoshita et al. | |
| 7,026,650 B2* | 4/2006 | Ryu | H01L 29/1608 257/408 |
| 7,049,675 B2 | 5/2006 | Kinoshita et al. | |
| 7,812,368 B2* | 10/2010 | Schulze | H01L 29/0619 257/131 |
| 7,964,485 B1* | 6/2011 | French | H01L 21/2253 438/548 |
| 8,716,717 B2 | 5/2014 | Kawakami et al. | |
| 2004/0135153 A1 | 7/2004 | Ryu et al. | |
| 2006/0043480 A1 | 3/2006 | Tsuchitani et al. | |
| 2010/0044825 A1* | 2/2010 | Schmidt | H01L 21/266 257/493 |
| 2010/0289032 A1* | 11/2010 | Zhang | H01L 21/0465 257/77 |
| 2011/0195563 A1* | 8/2011 | Okuno | H01L 21/0465 438/518 |
| 2012/0302051 A1* | 11/2012 | Matsuno | H01L 29/1608 438/571 |
| 2013/0037851 A1* | 2/2013 | Gejo | H01L 29/0634 257/139 |

FOREIGN PATENT DOCUMENTS

| | | |
|---|---|---|
| JP | 2000-516767 | 12/2000 |
| JP | 2003-78138 | 3/2003 |
| JP | 3708057 | 10/2005 |
| JP | 3997551 | 10/2007 |
| JP | 2008-10506 | 1/2008 |
| WO | 98/02924 A2 | 1/1998 |

OTHER PUBLICATIONS

International Search Report issued Oct. 30, 2012, in PCT/JP2012/069700, filed Aug. 2, 2012.
R. Stengl, et al., "Variation of Lateral Doping—A New Concept to Avoid High Voltage Breakdown of Planar Junctions", IEDM, vol. 85, 1985, pp. 154-157.
U.S. Appl. No. 14/430,746, filed Mar. 24, 2015, Kawakami, et al.
Search Report issued May 30, 2016, in Chinese Patent Application No. 201280067175.3 (with partial English Translation).

* cited by examiner

F I G . 1
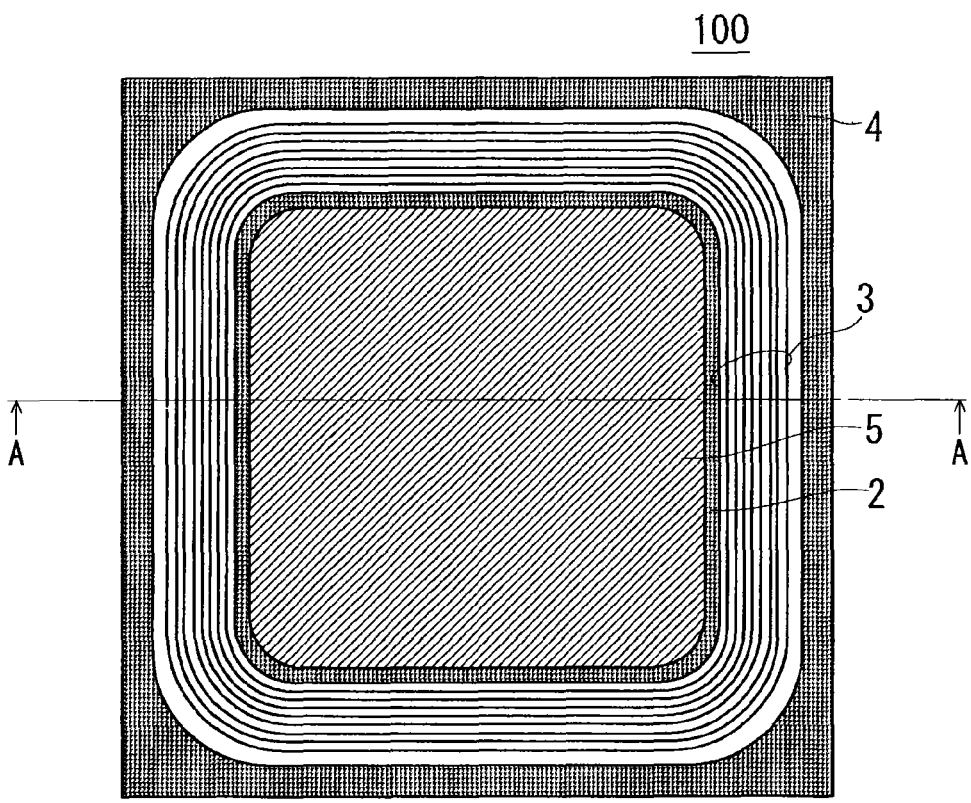
F I G . 2
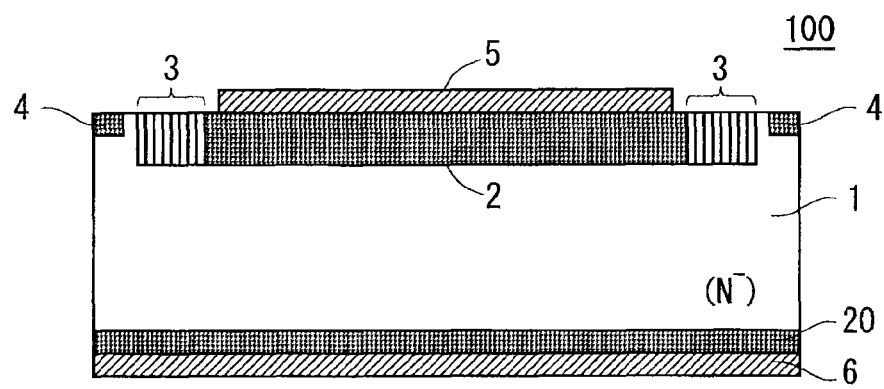

F I G. 5
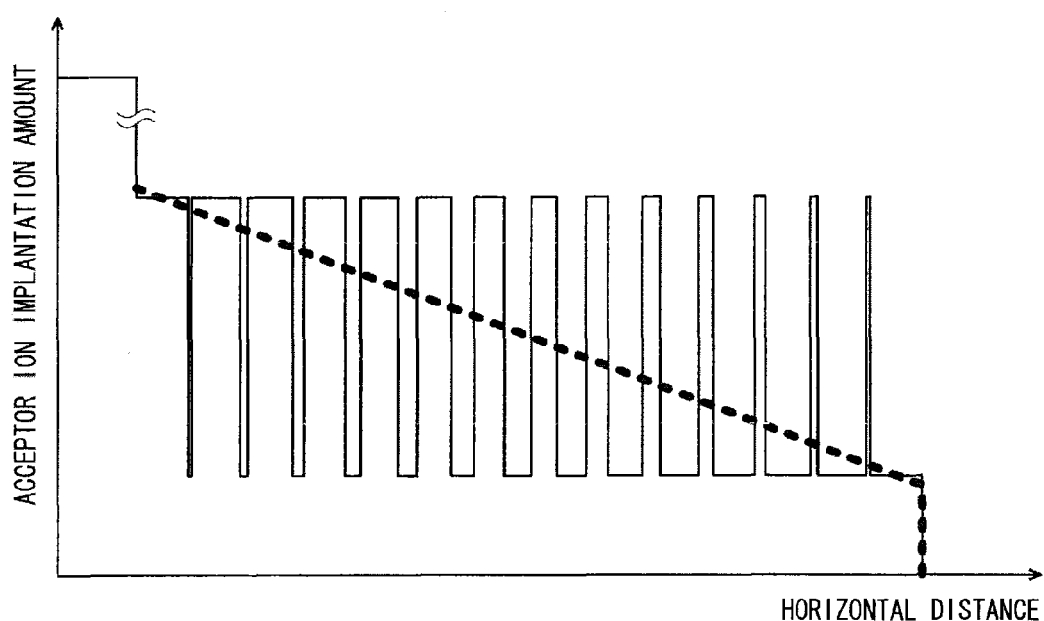
F I G. 6
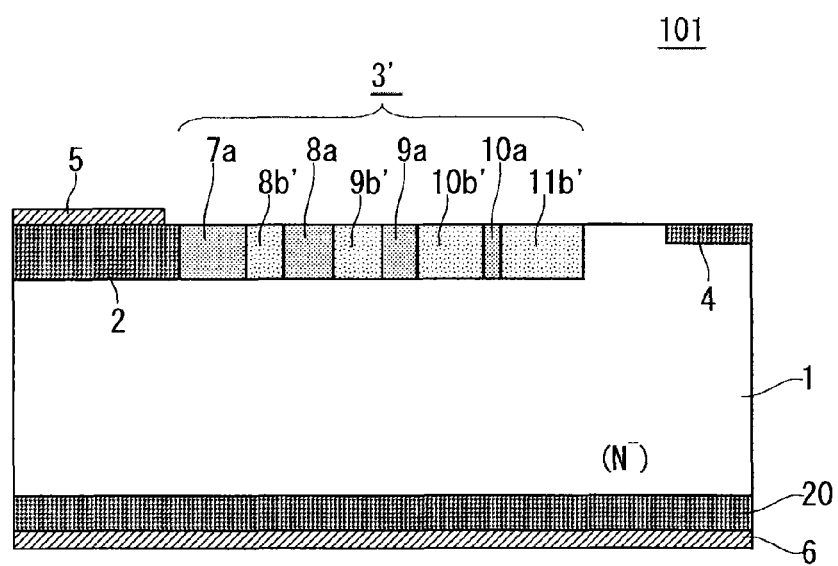

F I G . 7
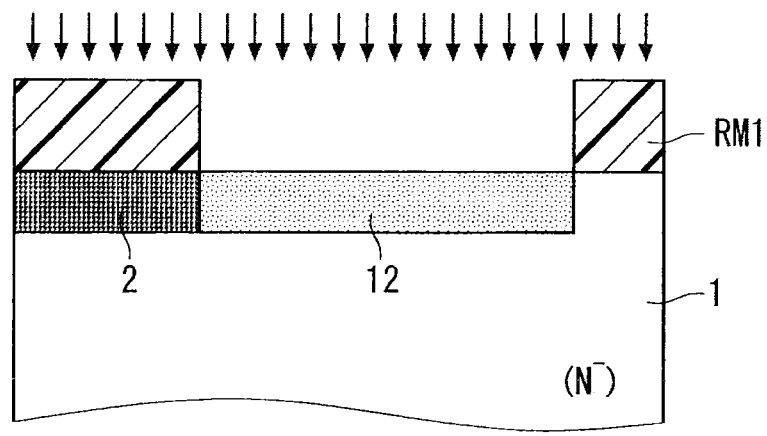
F I G . 8
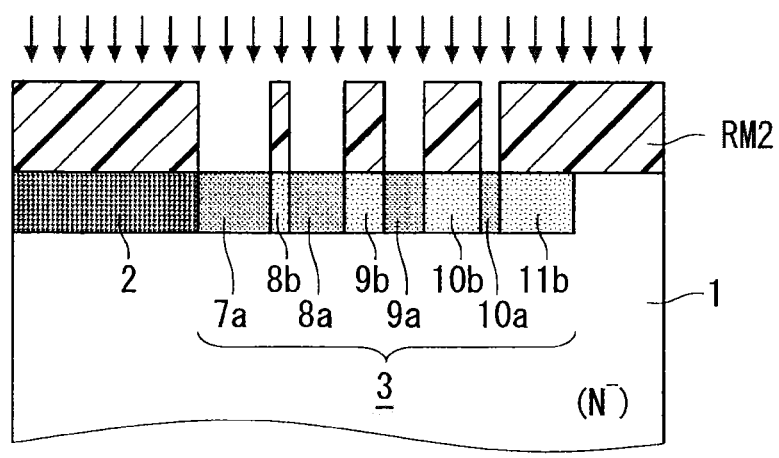

F I G . 9
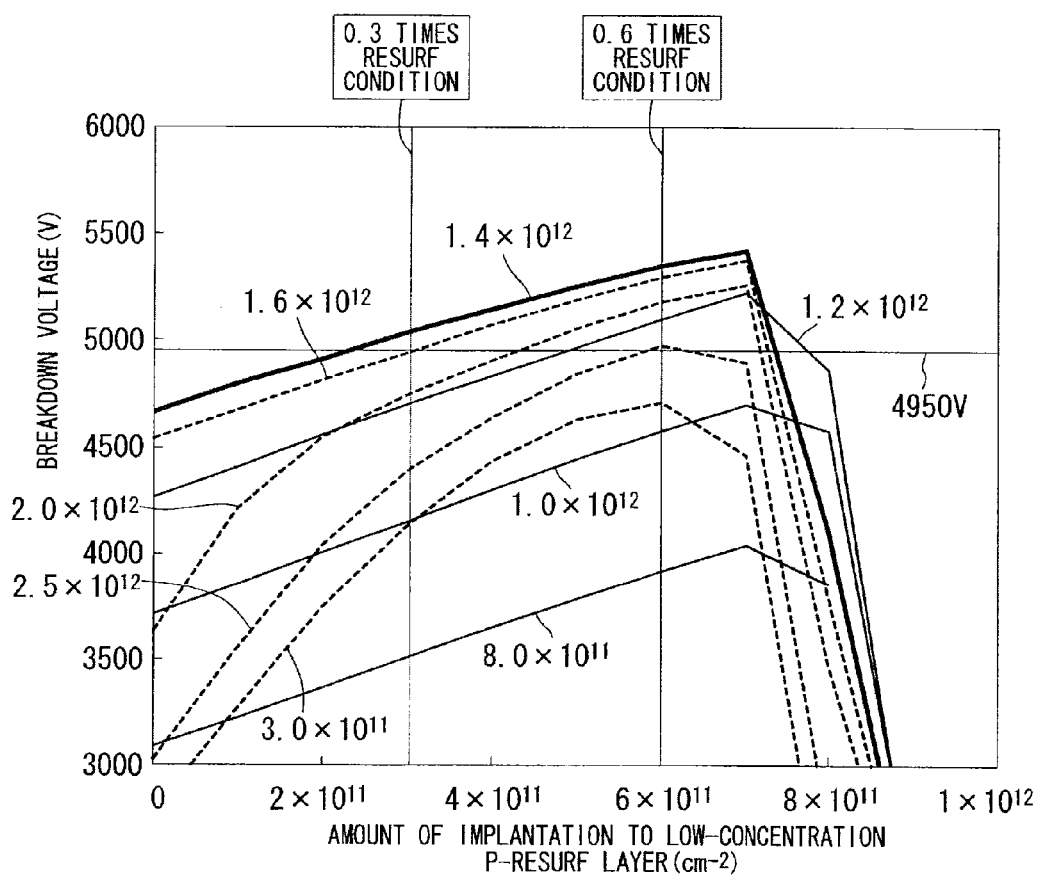

F I G. 1 0
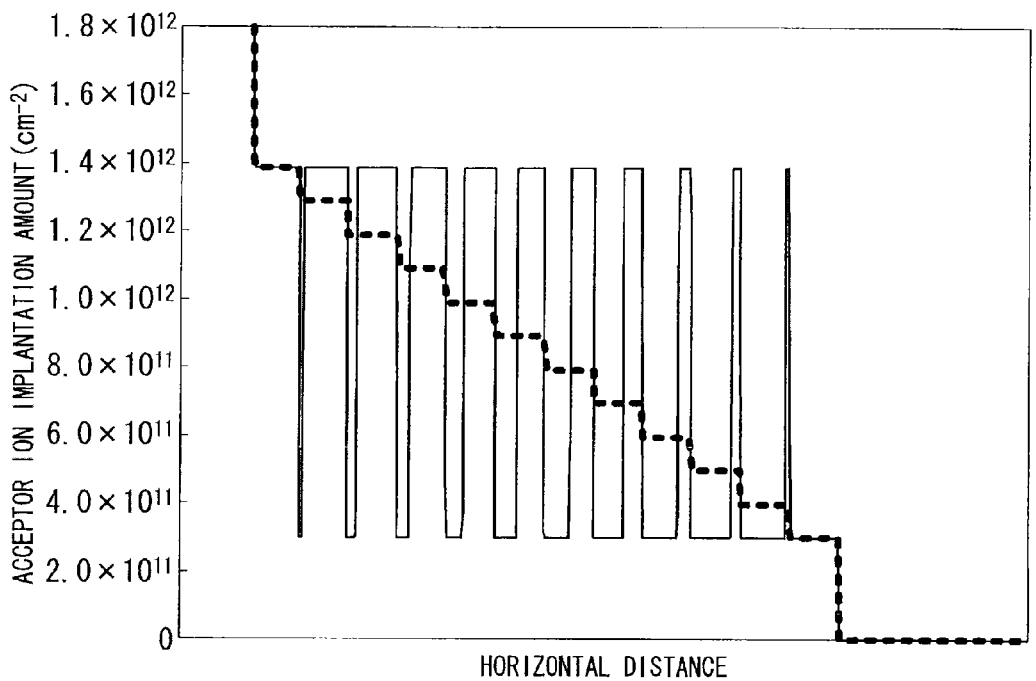
F I G. 1 1
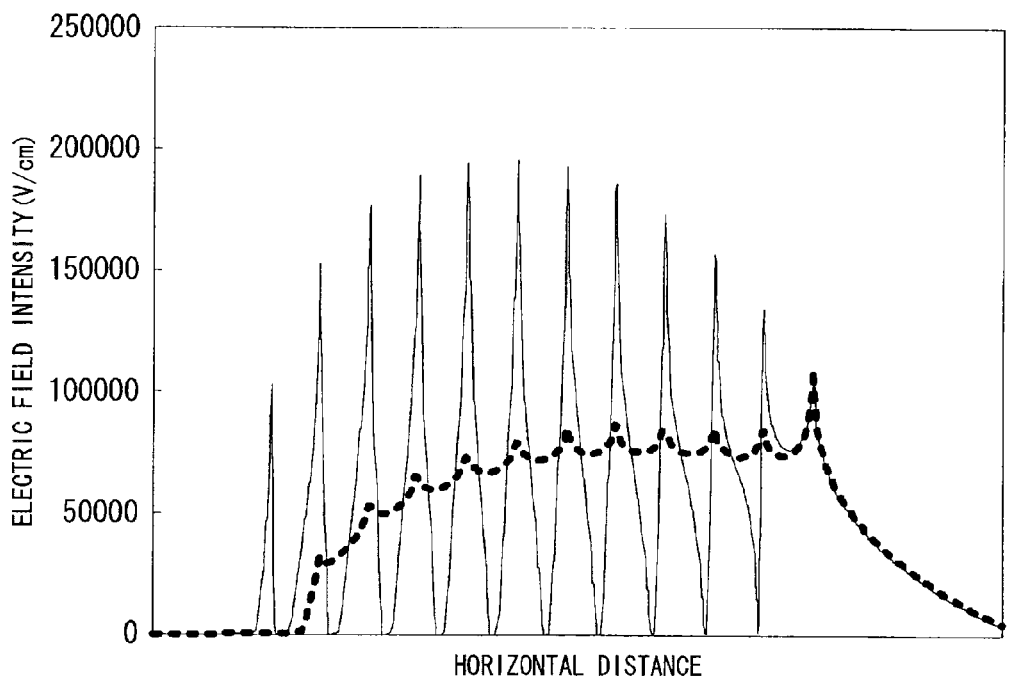

F I G. 1 2
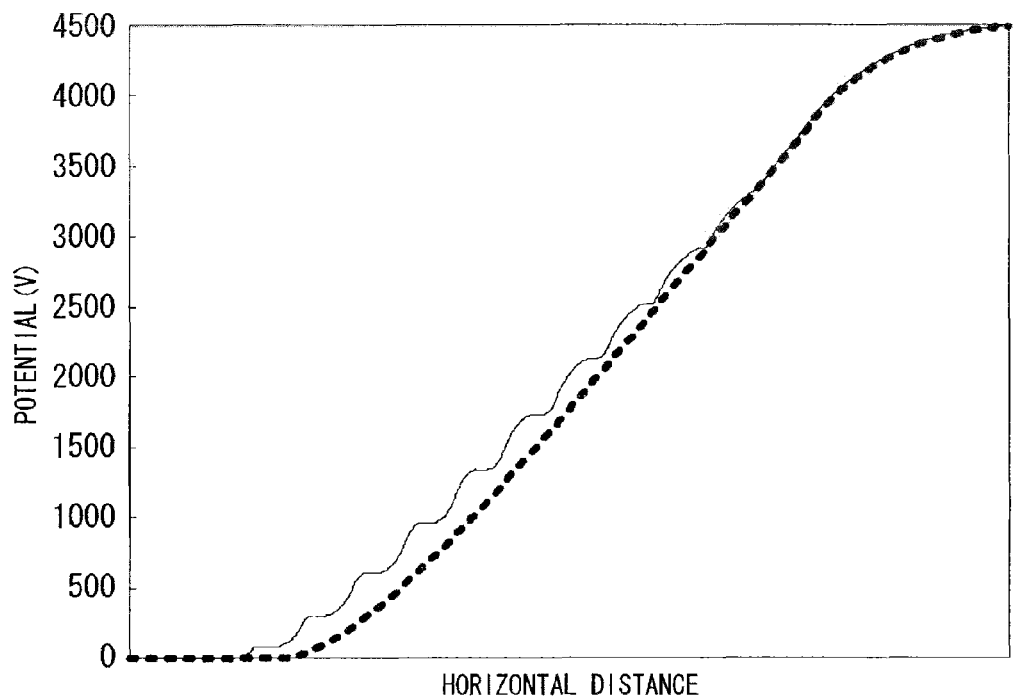
F I G. 1 3
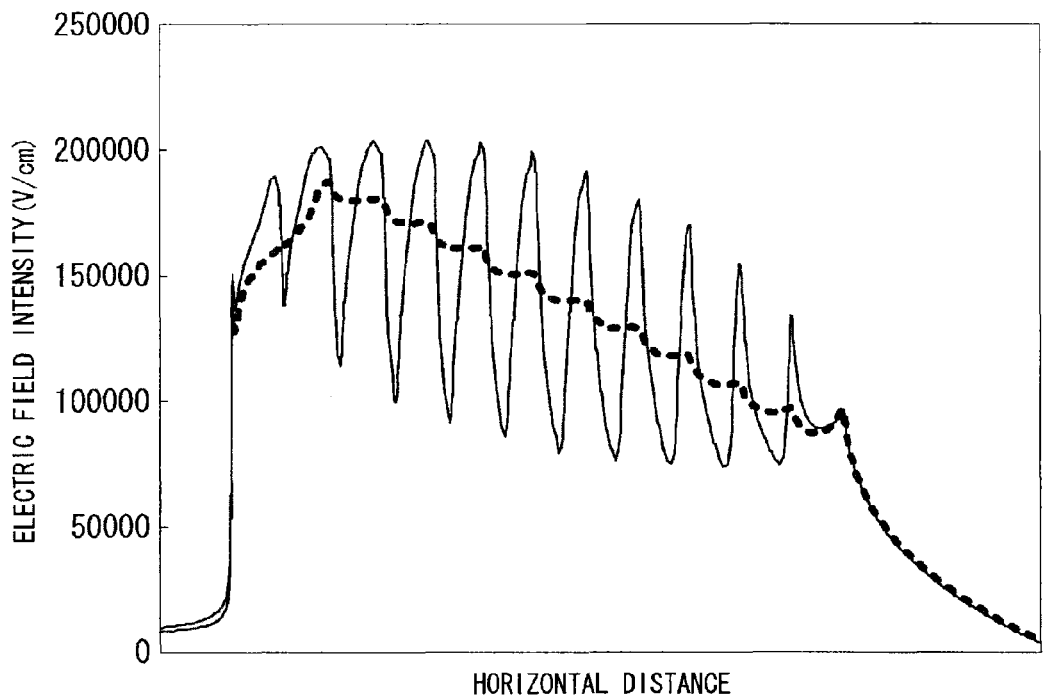

200

201

F I G. 1 7
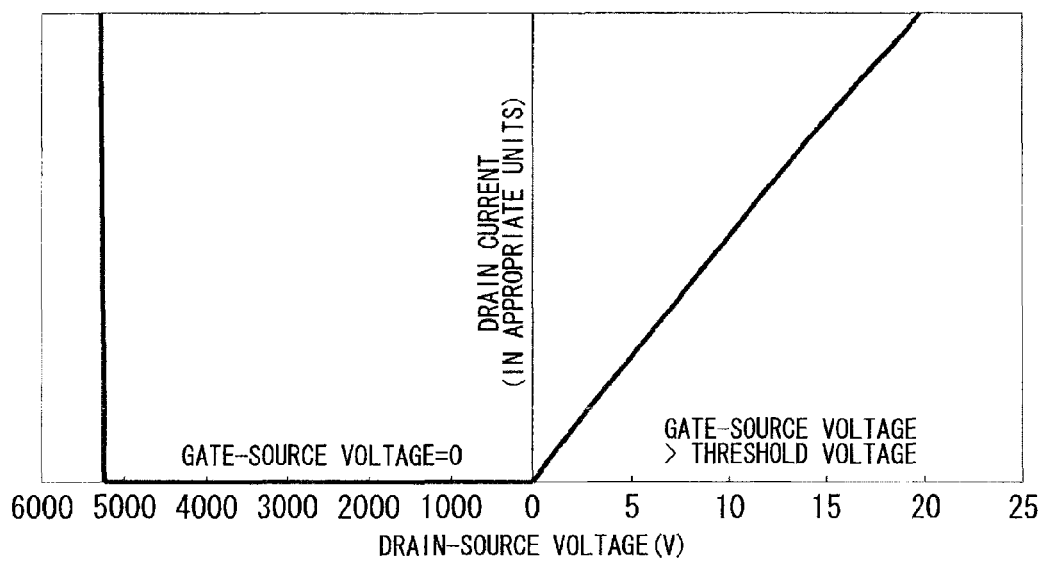
F I G. 1 8
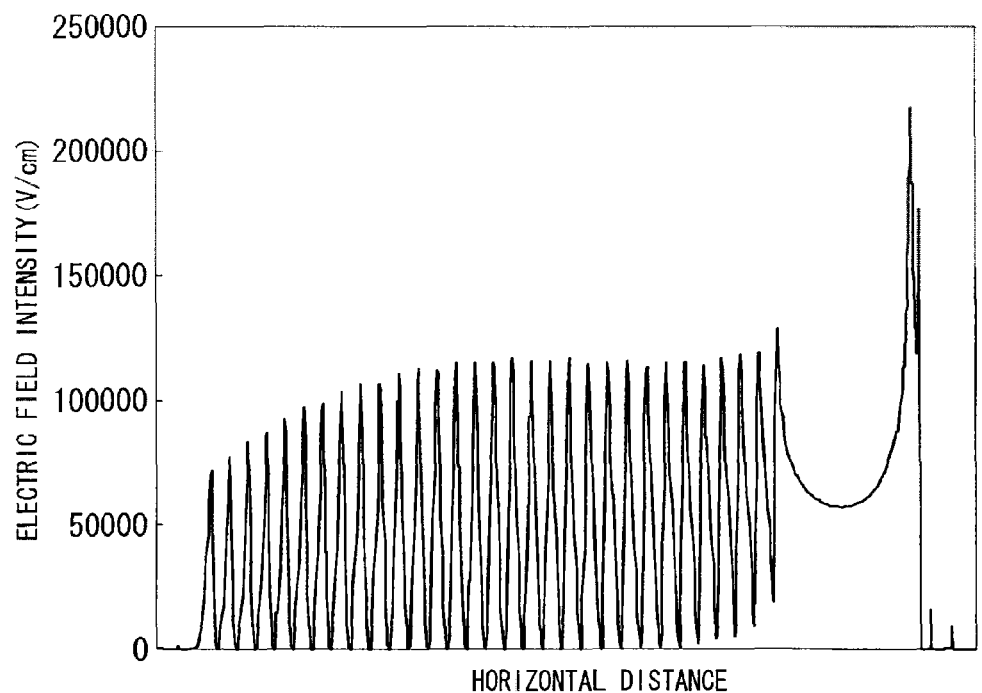

F I G . 3 0
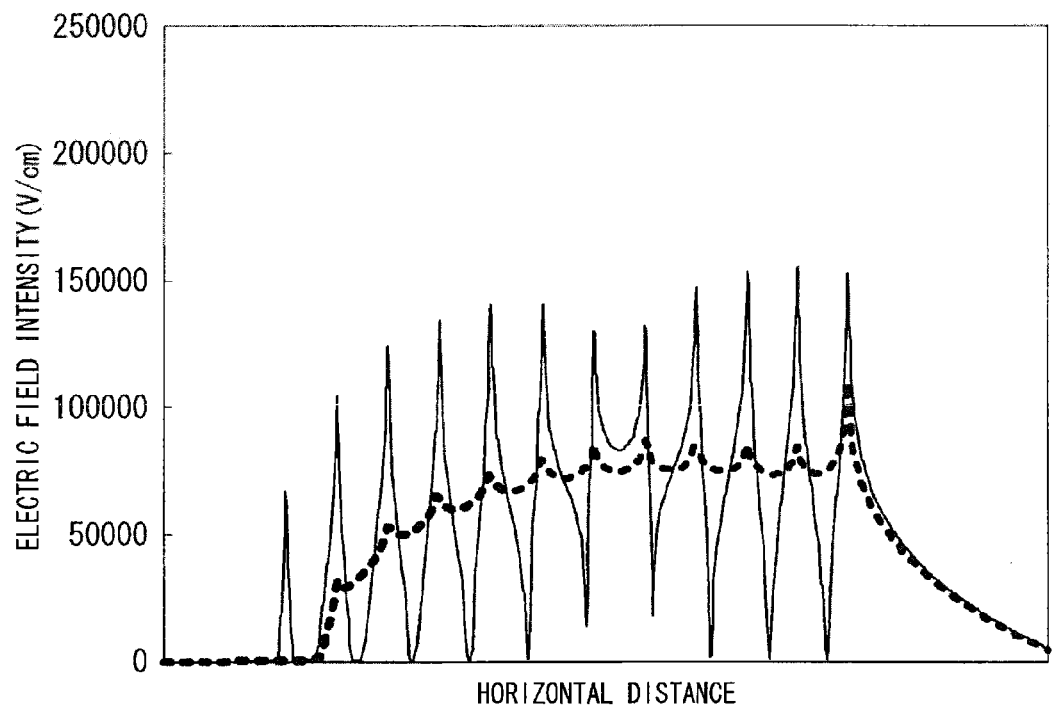
F I G . 3 1
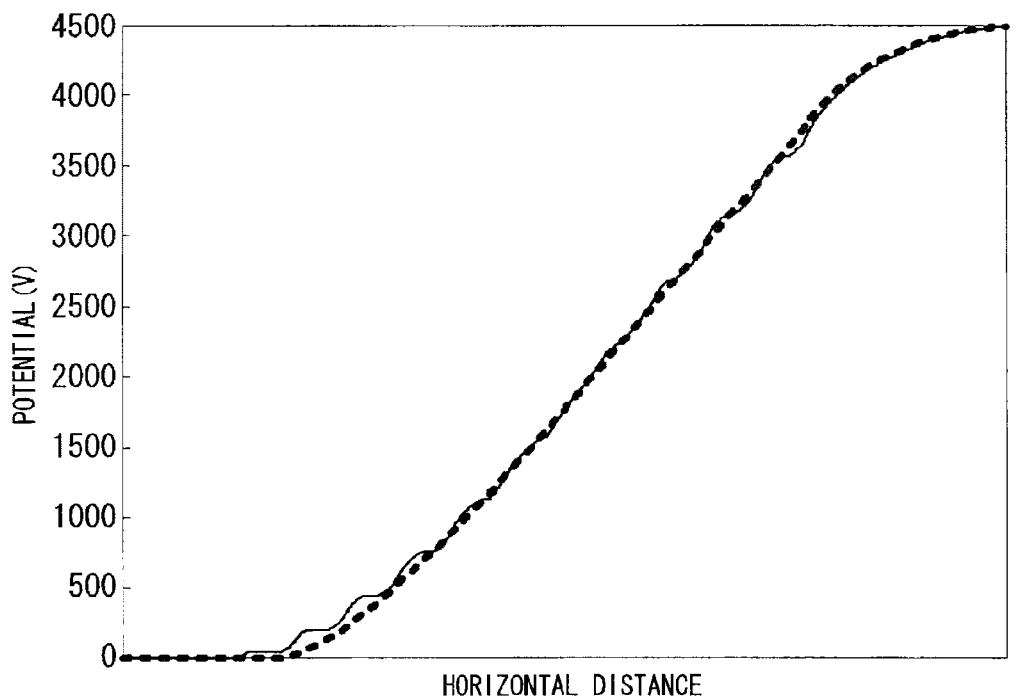

F I G . 3 4

| TYPE OF TERMINAL STRUCTURE | FIRST EMBODIMENT TWO TYPES OF IMPLANTATION AMOUNTS | THIRD EMBODIMENT TWO TYPES OF IMPLANTATION AMOUNTS | REFERENCE STRUCTURE 1 12 STAGES OF IMPLANTATION AMOUNTS | REFERENCE STRUCTURE 2 ONE TYPE OF IMPLANTATION AMOUNT |
|---|---|---|---|---|
| NUMBER OF IMPURITY IMPLANTATIONS | TWICE | TWICE | FOUR OR MORE TIMES | ONCE |
| MAXIMUM ELECTRIC FIELD INTENSITY (4500V) | 0.205 MV/cm | 0.199 MV/cm | 0.188 MV/cm | 0.245 MV/cm |
| BREAKDOWN VOLTAGE (ROOM TEMPERATURE) | 5036V | 5142V | 5091V | 4912V |

F I G . 3 8
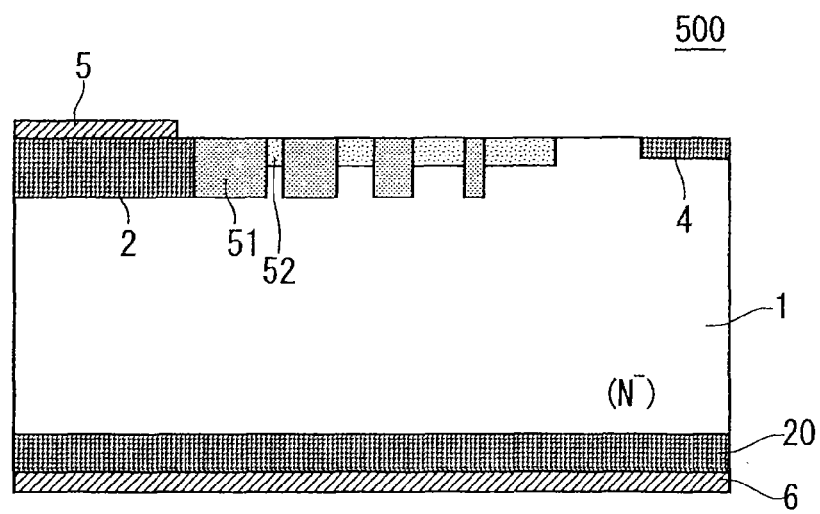
F I G . 3 9
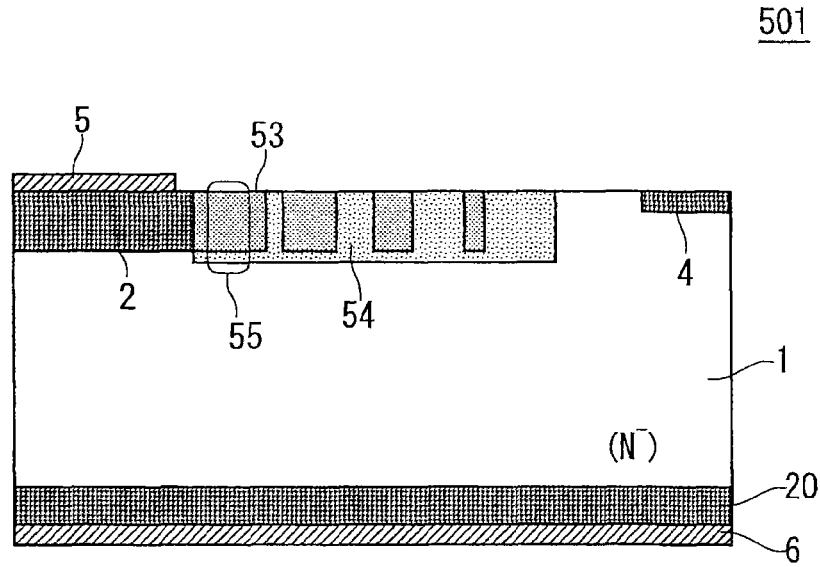

F I G . 4 0
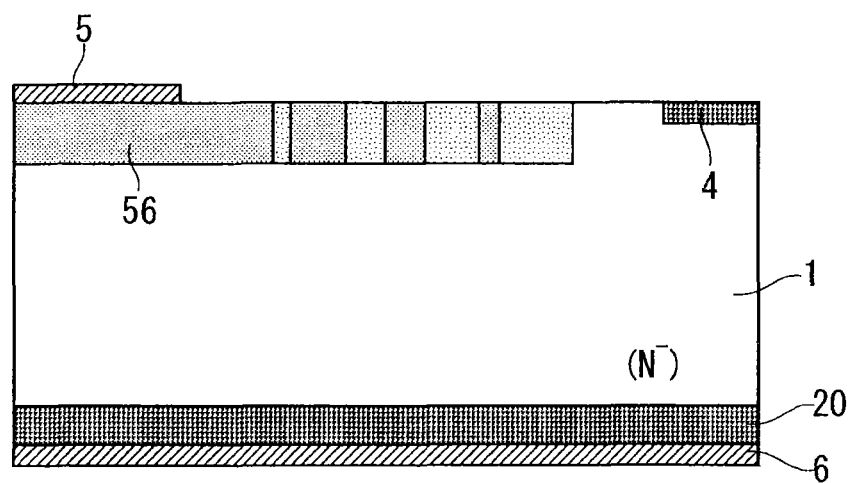

SEMICONDUCTOR DEVICE HAVING A PLURALITY OF ELECTRIC FIELD RELAXATION LAYERS AND METHOD FOR MANUFACTURING SAME

TECHNICAL FIELD

The present invention relates to semiconductor devices, and particularly, to a semiconductor device for power electronics that has a breakdown voltage of at least kilovolts.

BACKGROUND ART

Examples of the semiconductor devices (power semiconductor devices) having a breakdown voltage of 100 volts or higher that are used in power electronics include diodes, metal-oxide-semiconductor field-effect-transistors (MOSFETs), and insulated gate bipolar transistors (IGBTs). Those semiconductor devices are provided with the breakdown voltage structure for maintaining breakdown voltage resistance.

For example, the semiconductor device (vertical device) that flows current perpendicularly to the main surface of the semiconductor substrate has a termination structure formed so as to surround a region (active region) functioning as an active element, which serves as the breakdown voltage structure.

The semiconductor device (horizontal device) that flows current in parallel to the main surface of the semiconductor substrate has the breakdown voltage structure formed inside the active region.

The breakdown voltage structure functions to keep high voltage to be generated in the front surface of the main surface of the semiconductor substrate, irrespective of vertical devices or horizontal devices. High voltage is generated in the active region and the end of the semiconductor device in the vertical device, whereas high voltage is generated between electrodes inside the active region in the horizontal device.

Examples of the breakdown voltage of the semiconductor device include a reverse breakdown voltage of a diode and an off-breakdown voltage of a transistor. Such breakdown voltages are both defined as an upper-limit voltage to interrupt current (to flow no current).

While the semiconductor device interrupts current, a depletion layer extends inside the semiconductor substrate. This depletion layer can maintain high voltage. The application of a voltage exceeding the breakdown voltage leads to an avalanche breakdown in the portion inside the semiconductor substrate, in which an electric field is concentrated. As a result, the depletion layer is damaged, which causes short-circuit current to flow.

For example, in a PN junction diode (PIN diode) formed of a low-concentration N-type semiconductor substrate and a high-concentration P-type implantation layer, a depletion layer extends almost over the low-concentration N-type semiconductor substrate while the diode is turned off. Although it is this depletion layer that maintains high voltage, the breakdown voltage is limited due to an electric field concentration at the edge (peripheral edge) of the high-concentration P-type implantation layer.

The formation of a low-concentration P-type implantation layer in adjacent to the edge of the high-concentration P-type implantation layer causes the depletion layer to extend over both of the low-concentration N-type semiconductor substrate and the low-concentration P-type implantation layer. This relaxes the electric field at the edge of the high-concentration P-type implantation layer, increasing the breakdown voltage. This low-concentration P-type implantation layer is normally referred to as a reduced surface field (RESURF) layer or a junction termination extension (JTE). Such a breakdown voltage structure is referred to as a RESURF structure.

Although the depletion layer extends also in the RESURF layer in the RESURF structure, in terms of high breakdown voltage resistance, it is desirable to deplete the RESURF layer almost entirely up to the uppermost surface on a desired breakdown voltage. The condition for the above is defined by an amount of implantation (dose amount, implantation surface density) to the RESURF layer. If the amount of implantation to the entire RESURF layer is uniform, the optimum implantation amount is about $1 \times 10^{12}$ cm$^{-2}$ for silicon (Si) regardless of the concentration of the semiconductor substrate, and is $1 \times 10^{13}$ cm$^{-2}$ (with an activation rate of 100%) for polytype 4H silicon carbide (SiC). These are referred to as a RESURF condition.

The RESURF structure unfortunately has such a drawback that, in terms of high breakdown voltage resistance, an electric field is concentrated also on the peripheral edge of the RESURF layer. This limits the increasing of breakdown voltage to the avalanche breakdown on the peripheral edge of the RESURF layer. In other words, increasing breakdown voltage with the use of the normal RESURF structure is limited.

This problem can be avoided by gradually reducing the amount of implantation to the RESURF layer toward the outside, as described in Non-Patent Document 1 (or Patent Document 3 or 4). This structure divides the portion in which an electric field is concentrated into a plurality of portions, considerably reducing a maximum electric field inside the semiconductor.

The effects similar to those of Non-Patent Document 1 can be achieved also using the RESURF structure in which the amount of implantation to the RESURF layer is reduced stepwise toward the outside, as described in Patent Documents 1 and 2. In Patent Documents 1 and 2, an electric field is concentrated on the peripheral edge of the high-concentration P-type implantation layer, a boundary between the RESURF layers having different implantation amounts, and the outermost edge of the RESURF layer, and thus, the effect of relaxing an electric field is inferior to Non-Patent Document 1. Compared with the RESURF layer having a single implantation amount in its entirety, meanwhile, the portion in which an electric field is concentrated is divided, and thus, a maximum electric field inside the semiconductor substrate can be reduced.

PRIOR ART DOCUMENTS

Patent Documents

Patent Document 1: Japanese Patent No. 3997551
Patent Document 2: Japanese Unexamined Patent Application Publication No. 2000-516767
Patent Document 3: Japanese Patent Application Laid-Open No. 61-84830 (1986)
Patent Document 4: Japanese Examined Patent Application Publication No. 06-3799 (1994)

Non-Patent Document

Non-Patent Document 1: R. Stengl and U. Gosele, "Variation of lateral doping—A new concept to avoid high voltage breakdown of planar junctions", IEDM 85, p. 154, 1985.

SUMMARY OF INVENTION

Problems to be Solved by the Invention

As described above, the RESURF structure in which an amount of implantation to the RESURF layer reduces toward the outside is effective for increasing breakdown voltage.

The method of implanting impurities with a mask having a varying aperture ratio and making the concentration uniform through thermal diffusion to form a RESURF layer, as described in Non-Patent Document 1, normally needs a minute aperture pattern of not more than 1 μm and an annealing process (drive process) to be performed for a long period of time at high temperature. This method accordingly cannot be used in combination with the technology that needs a resist mask having a large film thickness, such as mega-electron-volt (MeV) ion implantation. In addition, the annealing process (drive process) to be performed for a long period of time at high temperature for thermal diffusion not only increases manufacturing costs but also reduces productivity. This method cannot be used for semiconductor materials having an extremely small thermal diffusion length of impurities, such as SiC, in the first place.

The methods of producing gradations in the amount of implantation to the RESURF layer, as described in Patent Documents 1 and 2, can reduce a maximum electric field inside the semiconductor more as the gradations in amount of implantation are increased. Unfortunately, as the gradations in amount of implantation are increased, the number of photolithography processes and the number of impurity implantation processes for mask formation are increased as well.

The present invention has been made to solve the above-mentioned problems and has an object to provide a semiconductor device including a RESURF layer capable of reducing the number of photolithography processes and the number of impurity implantation processes and achieving high breakdown voltage resistance if the graduations in amount of implantation increase.

Means to Solve the Problems

A semiconductor device according to an aspect of the present invention includes an active region formed in an upper layer portion of a semiconductor layer of a first conductivity type, and a plurality of electric field relaxation layers disposed from an edge of the active region toward the outside so as to surround the active region. The plurality of electric field relaxation layers include a plurality of first electric field relaxation layers and a plurality of second electric field relaxation layers alternately disposed adjacent to each other, the first electric field relaxation layer and the second electric field relaxation layer adjacent to each other forming a set. Impurities of a second conductivity type are implanted to the first electric field relaxation layers at a first surface density, widths of the first electric field relaxation layers becoming smaller as apart from the active region. Impurities of the second conductivity type are implanted to the second electric field relaxation layers at a second surface density lower than the first surface density, widths of the second electric field relaxation layers becoming larger as apart from the active region. The plurality of electric field relaxation layers are disposed in order of the first electric field relaxation layer and the second electric field relaxation layer from the active region side.

EFFECTS OF THE INVENTION

The semiconductor device according to the aspect of the present invention requires only two photolithography processes and two impurity implantation processes even if the gradations in amount of implantation increase. This reduces the number of photolithography processes and the number of impurity implantation processes, resulting in a manufacturing cost reduction. Also, the configuration can be made such that the amounts of impurity implantations to the plurality of electric field relaxation layers forming the RESURF layer decrease at multiple stages toward the outside, and thus, a semiconductor device having high breakdown voltage resistance can be obtained.

BRIEF DESCRIPTION OF DRAWINGS

FIG. 1 A plan view showing a configuration of a diode to which the present invention is applied.

FIG. 2 A cross-sectional view showing the configuration of the diode to which the present invention is applied.

FIG. 5 A diagram showing a horizontal distribution of an amount of implantation to the P-RESURF layer in the semiconductor device according to the first embodiment of the present invention.

FIG. 6 A cross-sectional view showing a configuration in which a minimum width of a low-concentration P-RESURF layer of the semiconductor device according to the first embodiment of the present invention is increased.

FIG. 7 A cross-sectional view describing the step of manufacturing the P-RESURF layer of the semiconductor device according to the first embodiment of the present invention.

FIG. 8 A cross-sectional view describing the step of manufacturing the P-RESURF layer of the semiconductor device according to the first embodiment of the present invention.

FIG. 9 A diagram showing the dependence of a breakdown voltage on an amount of implantation in the P-RESURF layer of the semiconductor device according to the first embodiment of the present invention.

FIG. 10 A diagram showing a horizontal distribution of an amount of implantation to the P-RESURF layer included in the semiconductor device according to the first embodiment of the present invention.

FIG. 11 A diagram showing simulation results on the electric field intensity in the semiconductor device according to the first embodiment of the present invention.

FIG. 12 A diagram showing simulation results on the potential in the semiconductor device according to the first embodiment of the present invention.

FIG. 13 A diagram showing simulation results on electric field intensity in the semiconductor device according to the first embodiment of the present invention.

FIG. 17 A diagram showing current-voltage characteristics of the semiconductor device according to the second embodiment of the present invention.

FIG. 18 A diagram showing simulation results on the electric field intensity in the semiconductor device according to the second embodiment of the present invention.

FIG. 30 A diagram showing simulation results on the electric field intensity in the semiconductor device according to the third embodiment of the present invention.

FIG. 31 A diagram showing simulation results on the potential in the semiconductor device according to the third embodiment of the present invention.

FIG. 34 A diagram showing simulation results on the structures of the RESURF layers according to the first and third embodiments of the present invention and reference structures.

FIG. 38 A cross-sectional view showing a configuration of another example to which the semiconductor device according to the first embodiment of the present invention is applied.

FIG. 39 A cross-sectional view showing a configuration of another example to which the semiconductor device according to the first embodiment of the present invention is applied.

FIG. 40 A cross-sectional view showing a configuration of another example to which the semiconductor device according to the first embodiment of the present invention is applied.

DESCRIPTION OF EMBODIMENTS

Figure 3:
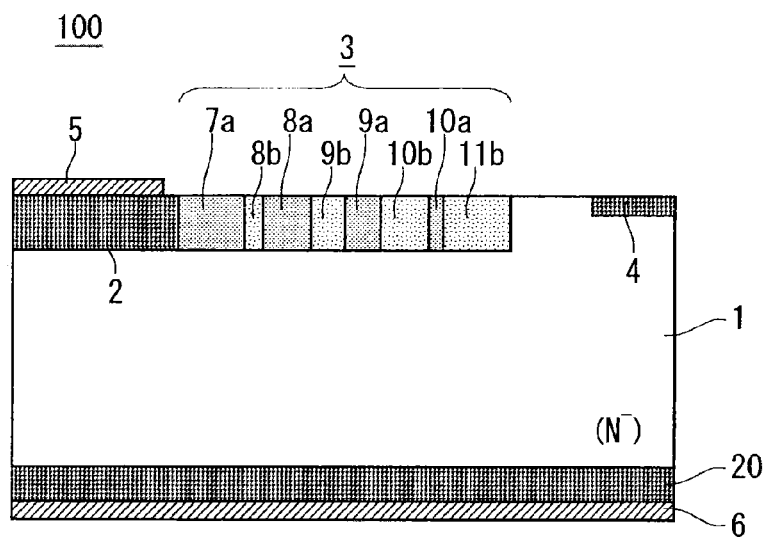
FIG. 3 A cross-sectional view showing a configuration of a semiconductor device according to a first embodiment of the present invention.

<Overall Configuration of Diode to which the Present Invention is Applied>

FIG. 1 is a plan view showing the configuration of a PIN diode 100 in a case where the present invention is applied to a vertical diode. FIG. 2 is a cross-sectional view showing a cross-section taken along the line A-A in FIG. 1. As shown in FIGS. 1 and 2, in the PIN diode 100, an active region 2 formed of an implantation layer containing a relatively high concentration of P-type impurities is formed in a surface of a semiconductor substrate 1 containing a relatively low concentration (N) of N-type impurities. In addition, a RESURF layer 3 (electric field relaxation layer) formed of a plurality of P-type implantation layers having different concentrations is formed so as to surround the active region 2. Further, a stopper layer 4 formed of an N-type implantation layer containing a relatively high concentration of N-type impurities is formed at the device edge that is located apart from the RESURF layer 3. Here, the structure extending from the RESURF layer 3 to the stopper layer 4, which is located outside the active region 2, serves as the termination structure.

An anode electrode 5 is disposed on the active region 2. A cathode layer 20 formed of an implantation layer containing a relatively high concentration of N-type impurities is formed in the front surface of the main surface of the semiconductor substrate 1 (substrate back surface) opposite to the active region 2. A cathode electrode 6 is disposed on the cathode layer 20.

In this configuration, a bias voltage is applied between the anode electrode 5 being in contact with the active region 2 and the cathode electrode 6 on the substrate back surface, so that the diode 100 functions as a PN junction diode.

Description will be mainly given below of the configuration of the RESURF layer 3, as the embodiment of the semiconductor device according to the present invention.

<A. First Embodiment>
<A-1. Device Configuration>

FIG. 3 is a partial cross-sectional view of the vertical PIN diode 100 to which the present invention is applied, shown in FIG. 1.

As shown in FIG. 3, the active region (P-base layer) 2 containing a relatively high concentration of P-type impurities is formed in the surface of the semiconductor substrate 1 containing a relatively low concentration (N) of N-type impurities. The P-RESURF layer 3 (electric field relaxation layer) formed of a plurality of P-type implantation layers having different concentrations is formed to surround the P-base layer 2.

The stopper layer 4 containing a relatively high concentration of N-type impurities is formed at the device edge that is located apart from the P-RESURF layer 3.

The P-RESURF layer 3 is formed of two types of P-type implantation layers having different implantation amounts. For brevity, here, the two types of P-type implantation layers have a substantially identical implantation depth and are formed to have a depth larger than that of the stopper layer 4 and to have an implantation depth substantially identical to that of the P-base layer 2. The RESURF layer to which P-type impurities are implanted at a relatively high amount of implantation is referred to as a high-concentration P-RESURF layer, whereas the RESURF layer having an amount of implantation lower than that of the high-concentration RESURF layer is referred to as a low-concentration P-RESURF layer. The P-RESURF layer 3 is formed of a plurality of RESURF layers, and thus may be referred to as a plurality of electric field relaxation layers.

As shown in FIG. 3, a high-concentration P-RESURF layer 7a is adjacent to the outside of the P-base layer 2, a low-concentration P-RESURF layer 8b is adjacent to the outside of the high-concentration P-RESURF layer 7a, a high-concentration P-RESURF layer 8a is adjacent to the outside of the low-concentration P-RESURF layer 8b, a low-concentration P-RESURF layer 9b is adjacent to the outside of the high-concentration P-RESURF layer 8a, a high-concentration P-RESURF layer 9a is adjacent to the outside of the low-concentration P-RESURF layer 9b, a low-concentration P-RESURF layer 10b is adjacent to the outside of the high-concentration P-RESURF layer 9a, a high-concentration P-RESURF layer 10a is adjacent to the outside of the low-concentration P-RESURF layer 10b, and a low-concentration P-RESURF layer 11b is adjacent to the outside of the high-concentration P-RESURF layer 10a.

The widths of the high-concentration P-RESURF layers 7a, 8a, 9a, and 10a become gradually smaller toward the outside, whereas the widths of the low-concentration P-RESURF layers 8b, 9b, 10b, and 11b become gradually larger toward the outside.

The relationship of $w(7a)=w(8b)+w(8a)=w(9b)+w(9a)=w(10b)+w(10a)=w(11b)$ holds when the widths of the high-concentration P-RESURF layers 7a, 8a, 9a, and 10a of the P-RESURF layer 3 are represented by $w(7a)$, $w(8a)$, $w(9a)$, and $w(10a)$, respectively, and the widths of the low-concentration P-RESURF layers 8b, 9b, 10b, and 11b thereof are represented by $w(8b)$, $w(9b)$, $w(10b)$, and $w(11b)$, respectively.

The ratio of the widths of the high-concentration P-RESURF layers 7a, 8a, 9a, and 10a is $w(7a):w(8a):w(9a):w(10a)=4:3:2:1$, and the ratio of the widths of the low-concentration P-RESURF layers 8b, 9b, 10b, and 11b is $w(8b):w(9b):w(10b):w(11b)=1:2:3:4$.

Figure 4:
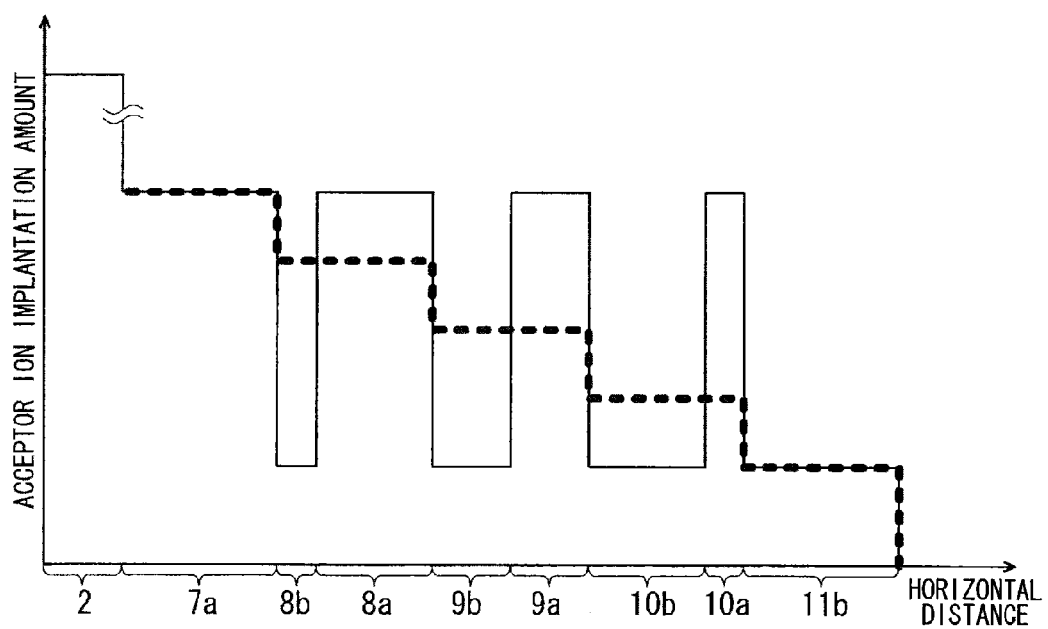
FIG. 4 A diagram showing a horizontal distribution of an amount of implantation to a P-RESURF layer in the semiconductor device according to the first embodiment of the present invention.

The implantation amount of acceptor ions (impurities) in the P-RESURF layer 3 is shown in graph form in FIG. 4, where the horizontal axis and the vertical axis represent a distance in the horizontal direction of the semiconductor substrate and an amount of implantation, respectively.

As indicated by the solid line in FIG. 4, the concentrations of the regions corresponding to the high-concentration P-RESURF layers 7a, 8a, 9a, and 10a are lower than that of the P-base layer 2 but are higher than those of the low-concentration P-RESURF layers 8b, 9b, 10b, and 1b. It is desirable that the amount of implantation to the high-concentration P-RESURF layer be about 1.2 to 2 times the RESURF condition and that the amount of implantation to the low-concentration P-RESURF layer be about 0.3 to 0.6 times the RESURF condition. The reason for this will be described below.

The amounts of implantations to a set of the adjacent low-concentration P-RESURF layer and the high-concentration P-RESURF layer are averaged, so that a stepwise implantation amount distribution as indicated by the broken line in FIG. 4 is obtained.

Assuming that the amount of implantation to the high-concentration P-RESURF layer 7a is a first stage, the average of the amounts of implantations to the low-concentration P-RESURF layer 8b and the high-concentration P-RESURF layer 8a is a second stage, the average of the amounts of implantations to the low-concentration P-RESURF layer 9b and the high-concentration P-RESURF layer 9a is a third stage, the average of the amounts of implantations to the low-concentration P-RESURF layer 10b and the high-concentration P-RESURF layer 10a is a fourth stage, and the amount of implantation to the low-concentration P-RESURF layer 11b is a fifth stage.

In FIG. 4, assuming that the high-concentration P-RESURF layer 7a forms a set with the low-concentration P-RESURF layer whose width is zero and that the low-concentration P-RESURF layer 11b forms a set with the high-concentration P-RESURF layer whose width is zero, the virtual number of gradations (number of steps) of implantation amounts is defined in accordance with the repetition number of sets each including the low-concentration P-RESURF layer and the high-concentration P-RESURF layer. The P-RESURF layer 3 becomes a P-RESURF layer having virtual five stages of implantation amounts in the horizontal direction of the substrate.

The repetition number of the sets each including the high-concentration P-RESURF layer and the low-concentration P-RESURF layer is further increased (N represents the repetition number of sets), the widths of the sets are made uniform, the widths of the high-concentration P-RESURF layers are made to have such a ratio that $(N-1):(N-2): \ldots :2:1$, and the widths of the low-concentration P-RESURF layers are made to have such a ratio that $1:2: \ldots :(N-2):(N-1)$. As a result, an implantation amount difference between sets becomes smaller and, as indicated by the broken line in FIG. 5, the RESURF layer in which implantation amounts decrease virtually is obtained. In FIG. 5, the horizontal axis and the vertical axis represent a distance in the horizontal direction of the substrate and an implantation amount, respectively.

The rate at which the widths of the high-concentration P-RESURF layers become smaller and the rate at which the widths of the low-concentration P RESURF layers become larger are made identical to each other in this manner, whereby the virtual step widths of implantation amounts can be made uniform. This results in a uniform rate at which the amounts of implantations to the RESURF layers gradually decreases.

Increasing the repetition number of the sets each including a high-concentration P-RESURF layer and a low-concentration P-RESURF layer allows the implantation amounts to gradually decrease linearly in a nearly ideal manner. Thus, the electric field inside the semiconductor substrate can be reduced further, in other words, a higher breakdown voltage can be obtained.

In this case, the number of repetitions may be increased by narrowing the width (repetition pitch) of the set of the adjacent low-concentration P-RESURF layer and high-concentration P-RESURF layer, with the P-RESURF layer 3 having a full width fixed. Alternatively, the full width of the P-RESURF layer 3 may be increased by increasing the number of repetitions, with the repletion pitch fixed.

The repetition pitch is desirably at least four or more times the minimum width of the low-concentration P-RESURF layer and the high-concentration P-RESURF layer. The minimum width is 1 to 2 p.m.

FIG. 3 shows an example of the P-RESURF layer 3 in which the widths of the high-concentration P-RESURF layers and the low-concentration P-RESURF layers are set such that the innermost low-concentration P-RESURF layer 8b has the same width as that of the outermost high-concentration P-RESURF layer 10a, which is not limited thereto.

The width of the innermost low-concentration P-RESURF layer may be larger than the width of the outermost high-concentration P-RESURF layer, or the width of the innermost low-concentration P-RESURF layer may be smaller than the width of the outermost high-concentration P-RESURF layer.

For example, if the amount of implantation to the high-concentration P-RESURF layer needs to be increased by two or more times the RESURF condition for any reason, a minimum width of the low-concentration P-RESURF layer may be increased to lower the average of the amounts of implantations to the set on the inner side. FIG. 6 shows one example of the above.

In a P-RESURF layer 3' of a PIN diode 101 shown in FIG. 6, the widths of the high-concentration P-RESURF layers 7a, 8a, 9a, and 10a are identical to those of the PIN diode 100 shown in FIG. 3, whereas the widths of low-concentration P-RESURF layers 8b', 9b', 10b', and 11b' are larger than the widths of the low-concentration P-RESURF layers 8b, 9b, 10b, and 11b shown in FIG. 3. This results in such a configuration that the width of the low-concentration P-RESURF layer 8b' having a minimum width is larger than that of the high-concentration P-RESURF layer 10a having a minimum width. The P-RESURF layer 3' is formed of a plurality of RESURF layers, and thus may be referred to as a plurality of electric field relaxation layers.

As described above, the P-RESURF layer 3 (FIG. 3) and the P-RESURF layer 3', in which the widths of the sets each including the high-concentration P-RESURF layer and the low-concentration P-RESURF layer are made uniform with the widths of the low-concentration P-RESURF layers gradually increasing toward the outside and the widths of the high-concentration P-RESURF layers gradually decreasing toward the outside, have the well-balanced configuration for obtaining high breakdown voltage resistance, robustness against process errors, and robustness against an operating environment of the semiconductor device also in a case where, for example, the repetition number of sets is small.

Although FIG. 5 shows an example in which the amount of implantation to the P-RESURF layer 3 gradually decreases at a uniform slope (tolerance), the slope needs not to be uniform as long as the implantation amount decreases monotonously.

A conceivable example of the above is a gradually decreasing pattern of decreasing monotonously with vertex up and decreasing monotonously with vertex down. As a simple example, the gradually decreasing pattern may be a pattern indicated by two straight lines and one zigzag line with angles. If the straight line on the P-base layer 2 side is an inner line and the other straight line is an outer line, "decreasing monotonously with vertex up" is a gradually decreasing pattern in which the descending slope of the inner line is gentler than the descending slope of the outer line, and "monotonously decreasing with vertex down" is a gradually decreasing pattern in which the descending slope of the inner line is steeper than the descending slope of the outer line.

As described above, the monotonously decreasing pattern with vertex up or with vertex down may be provided by adjusting the widths of the implantation layers without causing the amount of implantation to change uniformly. This allows for the adjustment of the degree of electric field concentration and the distribution of an electric field.

<A-2. Manufacturing Method>

With reference to FIGS. 7 and 8 showing the steps of manufacturing the P-RESURF layer 3 in order, next, the method of manufacturing the P-RESURF layer 3 will be described.

As shown in FIG. 7, the P-base layer 2 containing a relatively high concentration of P-type impurities is formed in the front surface of one main surface of the semiconductor substrate 1 containing a relatively low concentration (N) of N-type impurities. Then, a resist mask RM1, which has such a pattern that the portion corresponding to the region in which the P-RESURF layer 3 is formed is an opening, is formed on the above-mentioned one main surface.

Then, acceptor ions (P-type impurity ions) are implanted from above the resist mask RM1 such that an implantation amount corresponding to the low-concentration P-RESURF layer is obtained, thereby forming a low-concentration P-type impurity layer 12 in the entire region in which the P-RESURF layer 3 is formed.

Then, the resist mask RM1 is removed. After that, in the step shown in FIG. 8, a resist mask RM2, which has such a pattern that the portions corresponding to the high-concentration P-RESURF layers 7a, 8a, 9a, and 10a are openings, is formed. Then, acceptor ions are implanted from above the resist mask RM2 such that an implantation amount corresponding to a difference amount between the implantation amount corresponding to the high-concentration P-RESURF layer and the implantation amount corresponding to the low-concentration P-RESURF layer is obtained. As a result, the high-concentration P-RESURF layers 7a, 8a, 9a, and 10a are formed through the openings, and the low-concentration P-RESURF layers 8b, 9b, 10b, and 11b are formed in the portions that have been covered with the resist mask RM2.

As described above, the P-RESURF layer 3 having multiple stages of implantation amounts can be formed virtually through two photolithography processes and two impurity implantation (ion implantation) processes. Thus, the semiconductor device having high robustness against process errors such as an alignment error and a mask dimensional error can be obtained.

Although the manufacturing method described with reference to FIGS. 7 and 8 forms the P-base layer 2 and then forms the P-RESURF layer 3, those layers may be formed in a reverse order.

The first implantation of acceptor ions and the second implantation of acceptor ions may be performed in a reverse order.

For brevity, FIGS. 7 and 8 show that the acceptor ions reach the final implantation depth through ion implantation alone. This method is effective for semiconductor materials such as silicon carbide (SiC) resistant to thermal diffusion. For semiconductor materials having a relatively large diffusion length, such as Si, the implantation depth may be set to reach the portion near the front surface of the main surface of the semiconductor substrate 1, and the acceptor ions may be diffused deep through the annealing process.

On that occasion, acceptor ions are diffused in the depth direction as well as in the horizontal direction (lateral direction), which causes no problem except for that the concentration gradient between the high-concentration P-RESURF layer and the low-concentration P-RESURF layer becomes gentler. There is rather such an effect that an electric field generated at the concentration boundary is relaxed and a breakdown voltage is further increased, correspondingly to an amount for which the concentration gradient between the high-concentration P-RESURF layer and the low-concentration P-RESURF layer becomes gentler.

For semiconductor materials having a relatively large diffusion length, such as Si, the low-concentration P-RESURF layer having a small width that is disposed on the inner side may substantially disappear due to the lateral diffusion in the high-concentration P-RESURF layer. In such a case, to solve this problem, the widths of all the mask openings that correspond to the high-concentration P-RESURF layers may be reduced (that is, the widths of all the masks that correspond to the low-concentration P-RESURF layers may be increased).

For Si, when boron ions are implanted as acceptor ions and are thermally diffused through the annealing process in the vicinity of the front surface of the main surface of the semiconductor substrate 1, they are diffused laterally for about 80% of the thermal length in the depth direction. For example, the diffusion length of 6 μm in the depth direction allows lateral diffusion for about 4.8 μm from the implantation opening end. Similarly to the concentration profile in the depth direction, the concentration profile in the lateral direction decreases like the Gaussian distribution, and thus, the minimal distance between the implantation opening ends of the adjacent high-concentration P-RESURF layers is desirably set to 80% or more of the diffusion length in the depth direction.

The repetition number of the sets each including the low-concentration P-RESURF layer and the high-concentration P-RESURF layer (virtual gradation number of implantation amounts) is desirably four or more. This is because the P-RESURF layer having three types of implantation amounts can be formed through two photolithography processes and two impurity implantation processes, with little effect obtained by using the method of the present invention.

<A-3. Effects>

Next, the effects achieved in a case where the semiconductor device according to the first embodiment of the present invention is applied to a vertical Si PIN diode of 4500 V breakdown voltage class will be described with reference to FIGS. 9 to 14. The description below is based on the configuration in which the set of a low-concentration P-RESURF layer and a high-concentration P-RESURF layer is repeated 12 times.

FIG. 9 shows the dependence of breakdown voltage on the P-RESURF layer implantation amount at room temperature, which shows breakdown voltage characteristics when the horizontal axis and the vertical axis represent a low-concentration P-RESURF layer implantation amount ($cm^{-2}$) and a breakdown voltage (V), respectively, and the amounts of implantation ($cm^{-2}$) to the high-concentration P-RESURF layers are taken as parameters.

FIG. 9 shows breakdown voltage characteristics when the amount of implantation to the high-concentration P-RESURF layer is $8.0 \times 10^{11}$, $1.0 \times 10^{12}$, $1.2 \times 10^{12}$, $1.4 \times 10^{12}$, $1.6 \times 10^{12}$, $2.0 \times 10^{12}$, $2.5 \times 10^{12}$, and $3.0 \times 10^{12}$.

The $1.4 \times 10^{12}$ $cm^{-2}$ amount of implantation to the high-concentration P-RESURF layer, indicated by the thick line in FIG. 9, obtains the highest breakdown voltage, and thus, this amount is referred to as an optimum implantation amount. Meanwhile, the characteristics indicated by the solid lines show the characteristics for implantation amounts lower than the optimum implantation amount, whereas the characteristics indicated by the broken lines show the characteristics for implantation amounts higher than the optimum implantation amount.

FIG. 9 shows that in consideration of process errors, high breakdown voltage characteristics can be obtained stably when the amount of implantation to the high-concentration P-RESURF layer is about 1.2 to 2 times the RESURF condition and when the amount of implantation to the low-concentration P-RESURF layer is about 0.3 to 0.6 times the RESURF condition.

"High breakdown voltage" is defined here as a rated voltage+10% (4500 V+10%=4950 V) at room temperature, and "stable high breakdown voltage characteristics" are defined as such characteristics that a breakdown voltage of 4950 V can be obtained even if the amount of implantation to the low-concentration P-RESURF layer deviates by 10%. This is because the breakdown voltage in the RESURF structure according to the present invention is more likely to be affected by an amount of implantation to the low-concentration P-RESURF layer than by an amount of implantation to the high-concentration P-RESURF layer.

With reference to FIG. 9, the condition for obtaining a breakdown voltage of 4950 V even if an amount of implantation to the low-concentration P-RESURF layer deviates by ±10% is the case in which an amount of implantation to the high-concentration P-RESURF layer is 1.2 to 2 times ($1.2 \times 10^{12}$ to $2 \times 10^{12}$ $cm^{-2}$) the RESURF condition ($1 \times 10^{12}$ $cm^{-2}$). If $2.5 \times 10^{12}$ $cm^{-2}$, a deviation of the implantation amount cannot be permitted. In other words, a breakdown voltage of 4950 V cannot be obtained due to a slight deviation of the implantation amount.

The margin for the amount of implantation to the low-concentration P-RESURF layer is maximized when the amount of implantation to the high-concentration P-RESURF layer is $1.4 \times 10^{12}$ $cm^{-2}$. For the breakdown voltage characteristics in that case, even if an amount of implantation to the low-concentration P-RESURF layer deviates by ±10%, a breakdown voltage of 4950 V can be obtained as long as the implantation amount is 0.3 to 0.6 times ($3 \times 10^{11}$ to $6 \times 10^{11}$ $cm^{-2}$) the RESURF condition.

FIG. 10 shows an example of the implantation amount of acceptor ions in a case where the set of a low-concentration P-RESURF layer and a high-concentration P-RESURF layer is repeated 12 times, where the horizontal axis represents a distance in the plane direction (horizontal direction) of the P-base layer, P-RESURF layer, and low-concentration N-type semiconductor substrate, and the vertical axis represents an implantation amount (cm$^{-2}$).

A P-RESURF layer as shown in FIG. 10 can be obtained, which has 12 repetitions of the set of a low-concentration P-RESURF layer having an implantation amount of $3\times10^{11}$ cm$^{-2}$ and a high-concentration P-RESURF layer having an implantation amount of $1.4\times10^{12}$ cm$^{-2}$, including the set in which the width of one layer of the set is zero, and which has virtual 12 stages of implantation amounts, as indicated by the broken line. The simulation results on the P-RESURF layer having virtual 12 stages of implantation amounts will be described with reference to FIGS. 11 to 14.

FIG. 11 shows an electric field intensity (V/cm) on the front surface of the main surface of the semiconductor substrate (uppermost surface of the P-RESURF layer) on a reverse voltage of 4500 V, where the horizontal axis and the vertical axis represent a distance in the horizontal direction and an electric field intensity (V/cm), respectively.

FIG. 12 shows a potential (V) on the front surface of the main surface of the semiconductor substrate on a reverse voltage of 4500 V, where the horizontal axis and the vertical axis represent a horizontal direction and a potential (V), respectively.

FIG. 13 shows an electric field intensity (V/cm) at a depth (PN junction depth) equivalent to the implantation depth of the P-RESURF layer on a reverse voltage of 4500 V, where the horizontal axis and the vertical axis represent a distance in the plane direction and an electric field intensity (V/cm), respectively. The most intense electric field concentration occurs in the vicinity of the P-RESURF layer at the implantation depth in the semiconductor substrate.

Figure 14:
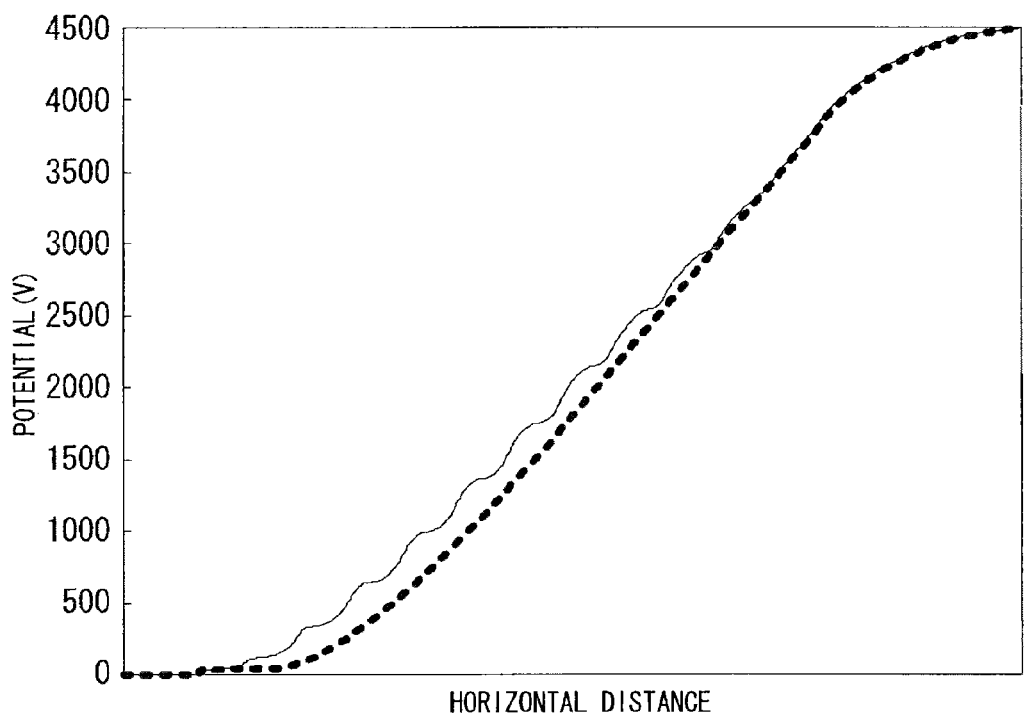
FIG. 14 A diagram showing simulation results on the potential in the semiconductor device according to the first embodiment of the present invention.

FIG. 14 shows a potential (V) at the depth (PN junction depth) equivalent to the implantation depth of the P-RESURF layer on a reverse voltage of 4500 V, where the horizontal axis and the vertical axis represent a distance in the horizontal direction and a potential (V), respectively.

FIGS. 11 and 13 show the comparison results of the electric fields between the structure of the P-RESURF layer having virtual 12 stages of implantation amounts according to the present invention and the structure of the P-RESURF layer actually formed to have 12 stages of implantation amounts (12-stage implantation structure). FIGS. 12 and 14 show the comparison of potentials.

In FIGS. 11 to 14, the solid lines correspond to the simulation results in the structure of the P-RESURF layer according to the present invention, and the broken lines correspond to the simulation results in the structure of the RESURF layer having the 12-stage implantation structure.

FIG. 11 reveals that the electric field intensity of the P-RESURF layer according to the present invention has a peak value twice as high as the 12-stage implantation structure, and that if the electric field intensities are averaged such that the peak of the electric field fills the dip of thereof in the set of the adjacent low-concentration P-RESURF layer and high-concentration P-RESURF layer, the distribution close to the electric field intensity distribution of the 12-stage implantation structure can be obtained in the portions except for both ends.

As shown in FIG. 12, the P-RESURF layer according to the present invention and the P-RESURF layer having the 12-stage implantation structure result in potential distributions extremely close to each other. The two potentials change substantially linearly to the distance, which is ideal as the breakdown voltage structure. This holds true for FIGS. 13 and 14 that show the electric field intensity and potential at the depth corresponding to the implantation depth of the P-RESURF layer, respectively.

The peak of the electric field intensity on the uppermost surface of the P-RESURF layer according to the present invention is conspicuous in FIG. 11, which causes no serious problem. This is because a maximum electric field inside the semiconductor substrate normally occurs near the PN junction near the portion at the implantation depth of the P-base layer and the P-RESURF layer, rather than on the front surface of the main surface.

The above is obvious from the fact that, through the comparison between FIGS. 11 and 13, the electric field intensity near the portion at the implantation depth of the P-RESURF layer is larger than that on the front surface of the main surface of the substrate.

The maximum electric field inside the semiconductor substrate in the P-RESURF layer according to the present invention is higher than that of the P-RESURF layer having the 12-stage implantation structure by about 9%, which causes no problem as long as the maximum electric field inside the semiconductor substrate is lower than the breakdown electric field of the semiconductor material (here, Si). It thus can be said that the P-RESURF layer according to the present invention has high breakdown voltage resistance (performance to keep high voltage) similarly to that of the P-RESURF layer having the 12-stage implantation structure.

The semiconductor device according to the present invention is capable of obtaining a PIN diode having high breakdown voltage resistance as described above.

The RESURF layer of this PIN diode can be formed through two photolithography processes and two impurity implantation processes. Thus, if the gradations in implantation amount increase, the numbers of the photolithography processes and the impurity implantation processes can be reduced.

Also, no minute opening pattern of not more than 1 µm is required, whereby the use in combination with the technology that requires a resist mask having a large film thickness, such as MeV ion implantation, is allowed. This requires no annealing process for a long period of time at high temperature for thermally diffusing impurities. Also, no thermal diffusion is required, which allows for the use of a semiconductor material such as SiC, in which the thermal diffusion length of impurities is extremely small.

<B. Second Embodiment>
<B-1. Device Configuration>

Figure 15:
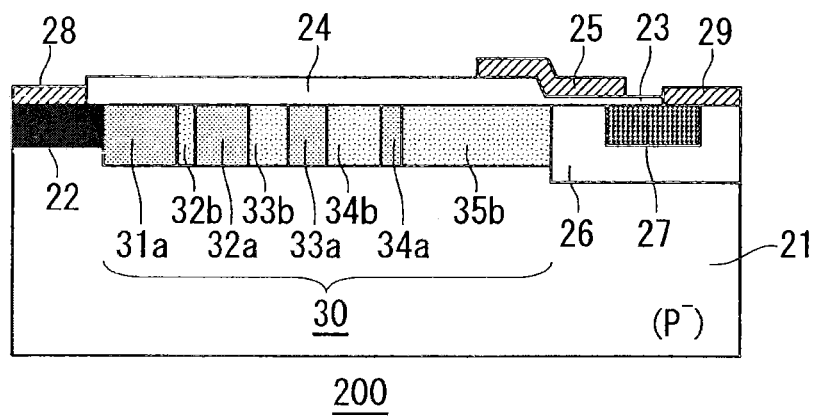
FIG. 15 A cross-sectional view showing a configuration of a semiconductor device according to a second embodiment of the present invention.

FIG. 15 is a partial cross-sectional view showing the configuration of an N-channel type MOSFET 200 to which the present invention is applied. The MOSFET 200 is an asymmetric lateral MOSFET and is referred to as a laterally doped MOSFET (LDMOSFET).

As shown in FIG. 15, the MOSFET 200 includes an N-type implantation layer (drain layer) 22 containing a relatively high concentration of N-type impurities that is provided in the front surface of one main surface of the semiconductor substrate 21 containing a relatively low concentration (P) of P-type impurities, a P-type implantation layer (P-well layer) 26 containing a relatively high concentration of P-type impurities provided in the surface of the semiconductor substrate 21 that is located apart from the drain layer 22, an N-type implantation layer (source layer) 27 containing a relatively high concentration of N-type impurities that is provided in the upper layer portion of the P-well layer 26, and an N-RESURF layer 30 provided between the drain layer 22 and the P-well layer 26.

A gate oxide 23 is formed from above the source layer 27 to above the P-well layer 26 on the N-RESURF layer 30 side, and a field oxide 24 thicker than the gate oxide 23 is formed from above the N-RESURF layer 30 to above the edge of the drain layer 22 to be continuous with the gate oxide 23.

A gate electrode 25 is formed from above the gate oxide 23 to above the field oxide 24, a drain electrode 28 is formed on the drain layer 22 that is not covered with the field oxide 24, and a source electrode 29 is formed on the source layer 27 that is not covered with the gate oxide 23. Here, the back surface of the semiconductor substrate 21 has the same potential as that of the source electrode 29.

The N-RESURF layer 30 is formed of two types of N-type implantation layers having different implantation amounts. For brevity, here, the two types of N-type implantation layers have a substantially identical implantation depth and are formed to have a depth smaller than the depth of the P-well layer 26 and have a depth larger than the depths of the source layer 27 and the drain layer 22. A RESURF layer having a relatively large implantation amount is referred to as a high-concentration N-RESURF layer, and a RESURF layer having an implantation amount smaller than that of the high-concentration RESURF layer is referred to as a low-concentration N-RESURF layer. The N-RESURF layer 30 is formed of a plurality of RESURF layers and may be referred to as a plurality of electric field relaxation layers.

As shown in FIG. 15, a high-concentration N-RESURF layer 31a is adjacent to the outside (source-side) of the drain layer 22, a low-concentration N-RESURF layer 32b is adjacent to the outside of the high-concentration N-RESURF layer 31a, a high-concentration N-RESURF layer 32a is adjacent to the outside of the low-concentration N-RESURF layer 32b, a low-concentration N-RESURF layer 33b is adjacent to the outside of the high-concentration N-RESURF layer 32a, a high-concentration N-RESURF layer 33a is adjacent to the outside of the low-concentration N-RESURF layer 33b, a low-concentration N-RESURF layer 34b is adjacent to the outside of the high-concentration N-RESURF layer 33a, a high-concentration N-RESURF layer 34a is adjacent to the outside of the low-concentration N-RESURF layer 34b, a low-concentration N-RESURF layer 35b is adjacent to the outside of the high-concentration N-RESURF layer 34a, and the P-well 26 is adjacent to the outside of the low-concentration N-RESURF layer 35b.

The widths of the high-concentration N-RESURF layers 31a, 32a, 33a, and 34a become gradually smaller toward the outside, whereas the widths of the low-concentration N-RESURF layers 32b, 33b, 34b, and 35b become gradually larger toward the outside.

If the drain layer 22 corresponds to the P-base layer 2, the P-well layer 26 corresponds to the stopper layer 4, and the N-RESURF layer 30 corresponds to the P-RESURF layer 3 though the conductivity types are opposite, the configuration of the MOSFET 200 is similar to the termination structure of the vertical PIN diode 100 shown in FIG. 3 according to the first embodiment, and the N-RESURF layer 30 has the breakdown voltage structure.

The method of manufacturing the N-RESURF layer 30 and the optimum implantation amount are similar to those for the P-RESURF layer 3 according to the first embodiment, though the conductivity types are opposite. Note that this embodiment differs from the first embodiment in that the N-RESURF layer 30 is adjacent to the P-well layer 26 and that the gate electrode 25 is provided above parts of the P-well layer 26 and N-RESURF layer 30 through the gate oxide 23 and field oxide 24.

While the MOSFET 200 is turned off, an electric field is concentrated conspicuously on the edge of the gate oxide 23 on the N-RESURF layer 30. Thus, the gate electrode 25 is extended up to above the N-RESURF layer 30 through the field oxide 24 to function as a field plate, thereby relaxing the electric field.

For this reason, the width of the low-concentration N-RESURF layer 35b is larger than, for example, the width of the set of the low-concentration N-RESURF layer 34b and the high-concentration N-RESURF layer 34a.

The extension of the width of the low-concentration N-RESURF layer 35b results in a reduction in the electric field on the front surface of the substrate below the gate electrode 25.

The above-mentioned configuration can maintain high voltage owing to the depletion layer extending in the semiconductor substrate 21 and the N-RESURF layer 30 in the off-state in which the source electrode 29 has a zero voltage, the gate electrode 25 has a zero voltage or a negative voltage, and the drain electrode 28 has a positive voltage. Meanwhile, in the on-state in which the source electrode 29 has a zero voltage, the gate electrode 25 has a positive voltage, and the drain electrode 28 has a positive voltage, the N-type channel is formed in the surface of the P-well layer 26 beneath the gate electrode 25, so that an electron current flows through a series of N-type paths formed of the source layer 27, the N-type channel in the surface of the P-well layer 26, the N-RESURF layer 30, and the drain layer 22.

Figure 16:
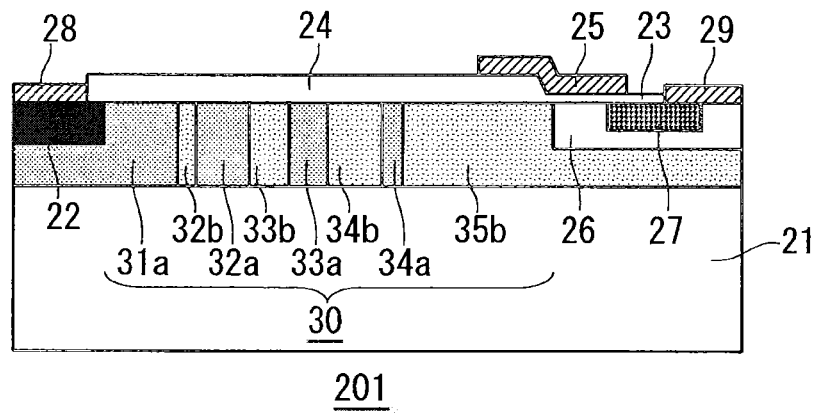
FIG. 16 A cross-sectional view showing a configuration of a modification of the semiconductor device according to the second embodiment of the present invention.

The MOSFET 200 shown in FIG. 15 is an example in which the implantation depth of the N-RESURF layer 30 is formed to be smaller than that of the P-well layer 26, which may have the configuration shown in FIG. 16.

In a MOSFET 201 shown in FIG. 16, the implantation depth of the N-RESURF layer 30 is formed to be larger than that of the P-well layer 26. The low-concentration N-RESURF layer 35b being in contact with the P-well layer 26 extends to be in contact not only with the side surface of the P-well 26 but also with the lower portion of the P-well 26. The high-concentration N-RESURF layer 31a extends to be in contact with the lower portion of the drain layer 22 as well.

<B-2. Effects>

Figure 19:
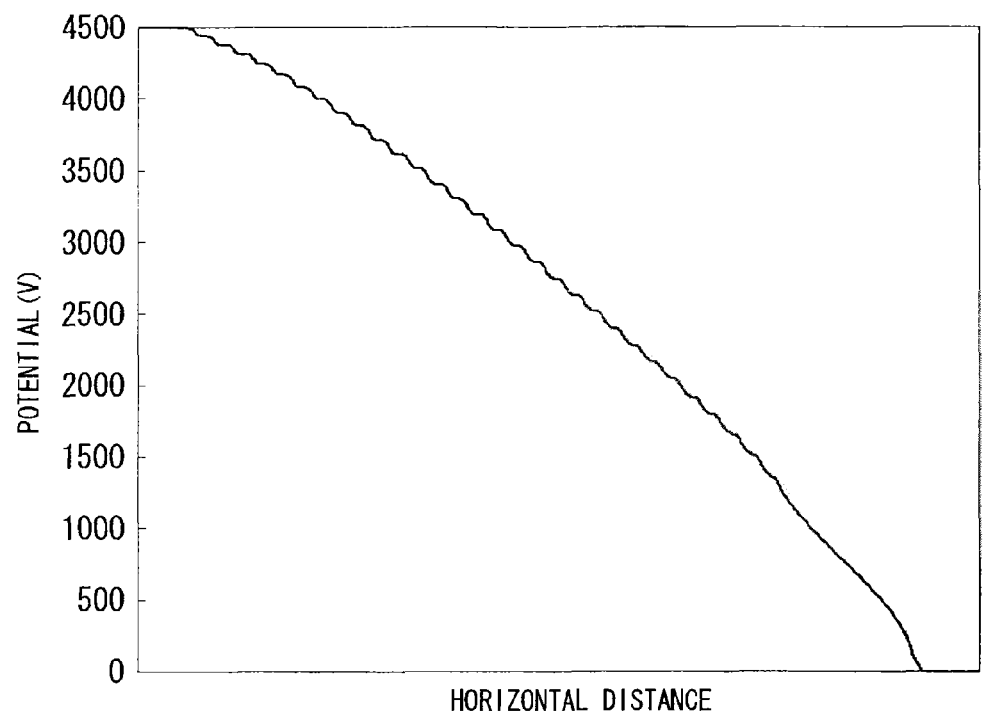
FIG. 19 A diagram showing simulation results on the potential in the semiconductor device according to the second embodiment of the present invention.

Next, the effects achieved in a case where the semiconductor device according to the second embodiment of the present invention is applied to the lateral Si MOSFET having the 4500 V breakdown voltage will be described with reference to FIGS. 17 to 19 showing simulation results. The description below is based on the configuration in which the set of a low-concentration N-RESURF layer and a high-concentration N-RESURF layer is repeated 32 times.

FIG. 17 shows current-voltage characteristics of the lateral MOSFET, where the horizontal axis and the vertical axis represent a drain-source voltage (V) and a drain current (in appropriate units), respectively. The gate-source voltage is zero in the region left relative to the vertical axis (zero drain-source voltage), and the gate-source voltage has a positive value equal to or larger than the threshold voltage in the region right relative thereto.

FIG. 18 shows an electric field intensity (V/cm) on the front surface of the main surface of the semiconductor substrate on a drain-source voltage of 4500 V, where the horizontal axis and the vertical axis represent a distance in the horizontal direction (plane direction) of the substrate and an electric field intensity (V/cm), respectively.

FIG. 19 shows a potential (V) on the front surface of the main surface of the semiconductor substrate on a drain-source voltage of 4500 V, where the horizontal axis and the vertical axis represent a distance in the horizontal direction and a potential (V), respectively.

It is revealed that as shown in FIG. 17, the lateral MOSFET is prevented from causing drain current to flow up to the drain-source voltage of 5000 V in the off-state where the gate-source voltage is zero, and accordingly, the lateral MOSFET operates normally as a transistor of 4500 V breakdown voltage class.

It is also revealed that as shown in FIGS. 18 and 19, though an electric field is concentrated on the portion corresponding to the portion below the gate electrode, characteristics of the electric field and potential of the N-RESURF layer are similar to those of the vertical PIN diode according to the first embodiment, and that the N-RESURF layer functions as an excellent breakdown voltage structure.

With reference to FIG. 18, the electric field intensity of the N-RESURF layer according to the present invention has a distribution in which a peak value is conspicuous. It is however estimated that in a set of the adjacent low-concentration N-RESURF layer and high-concentration N-RESURF layer, averaging performed to fill a dip of an electric field with a peak thereof enables an electric field intensity distribution with no conspicuous peak, and THUS, the electric field intensity distribution actually becomes close to the distribution of a 32-stage implantation structure. This reveals that as shown in FIG. 19, an ideal breakdown voltage structure in which potential changes substantially linearly to a distance is obtained.

The semiconductor device according to the present invention can obtain a lateral MOSFET having high breakdown voltage resistance as described above.

The RESURF layer of this lateral MOSFET can be formed through two photolithography processes and two impurity implantation processes. If the gradations in implantation amount increase, the numbers of the photolithography processes and the impurity implantation processes can be reduced.

Also, no minute opening pattern of not more than 1 μm is required, whereby the use in combination with the technology that requires a resist mask having a large film thickness, such as MeB ion implantation, is allowed. This requires no annealing process for a long period of time at high temperature for thermally diffusing impurities. Also, no thermal diffusion is required, which allows for the use of a semiconductor material such as SiC, in which the thermal diffusion length of impurities is extremely small.

<C. Third Embodiment>

In the lateral MOSFET according to the second embodiment of the present invention described above, all of the N-RESURF layers need to be formed of impurity layers having the same conductivity type for causing current to flow through the breakdown voltage structure. In the vertical diode as described in the first embodiment, however, the P-RESURF layer has a termination structure, and thus, all of the P-RESURF layers need not to be formed of impurity layers having the same conductivity type. Description will be given below of an example in which the RESURF layers are formed of impurity layers having different conductivity types.

<C-1. Device Configuration>

Figure 20:
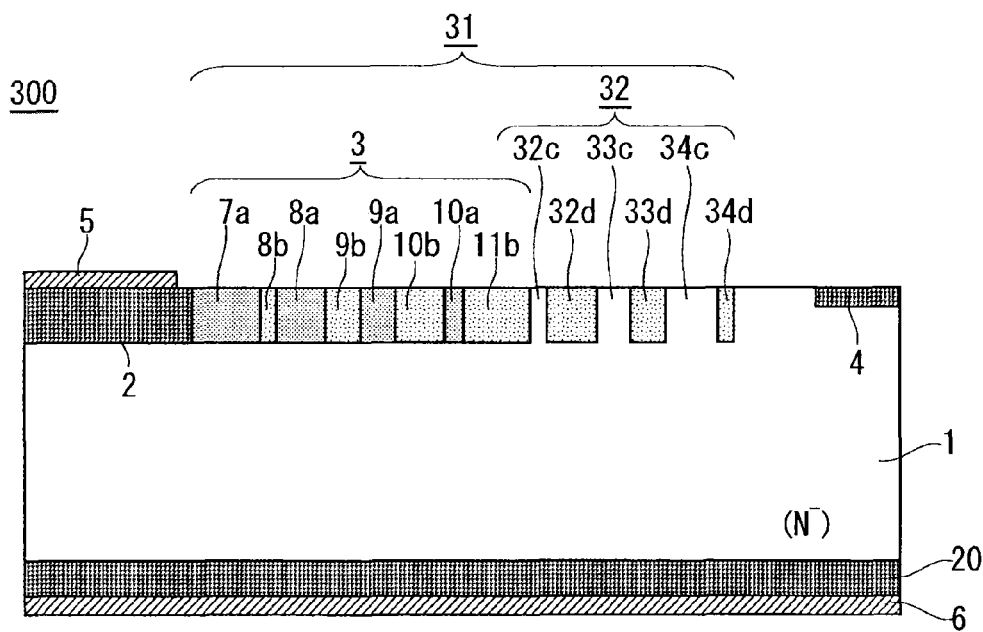
FIG. 20 A cross-sectional view showing a configuration of a semiconductor device according to a third embodiment of the present invention.

FIG. 20 is a partial cross-sectional view showing the configuration of a PIN diode 300 in a case where the present invention is applied to a vertical diode. The same references denote the same components as those of the PIN diode 100 shown in FIG. 3, and redundant description will not be given.

A RESURF layer 31 shown in FIG. 20 has a configuration including the P-RESURF layer 3 and an additional RESURF layer that is located outside the P-RESURF layer 3 (located on the stopper layer 4 side) and includes a plurality of low-concentration P-RESURF layers provided apart from each other. The P-RESURF layer 3 is formed of sets each including two types of P-type implantation layers having different implantation amounts, that is, a high-concentration P-RESURF layer and a low-concentration P-RESURF layer. The additional RESURF layer is an additional RESURF layer 32 in which a plurality of sets each including a low-concentration P-RESURF layer and a semiconductor layer that is adjacent to the low-concentration P-RESURF layer and contains a relatively low concentration ($N^-$) of N-type impurities are formed repeatedly.

With reference to FIG. 20, the P-RESURF layer 3 is adjacent to the outside of the P-base layer 2. A non-implantation N-region 32c is adjacent to the outside of the low-concentration P-RESURF layer 11b on the outermost edge of the P-RESURF layer 3. The non-implantation N-region 32c is a semiconductor layer containing no P-type impurities implanted but contains a relatively low concentration ($N^-$) of N-type impurities. A low-concentration P-RESURF layer 32d is provided to the outside of the non-implantation N-region 32c. A non-implantation N-region 33c is adjacent to the outside of the low-concentration P-RESURF layer 32d, and a low-concentration P-RESURF layer 33d is provided to the outside of the non-implantation N-region 33c. A non-implantation N-region 34c is adjacent to the outside of the low-concentration P-RESURF layer 33d, and a low-concentration P-RESURF layer 34d is provided to the outside of the non-implantation N-region 34c. The sets of the low-concentration P-RESURF layers 32d, 33d, and 34d and the non-implantation N-regions 32c, 33c, and 34c constitute the additional RESURF layer 32. The additional RESURF layer 32 is formed of a plurality of RESURF layers, and thus, also may be referred to as a plurality of additional electric field relaxation layers.

The widths of the low-concentration P-RESURF layers 11b, 32d, 33d, and 34d become gradually smaller toward the outside, while the widths of the non-implantation N-region 32c, 33c, and 34c become gradually larger toward the outside.

The relationship of $w(11b)=w(32c)+w(32d)=w(33c)+w(33d)=w(34c)+w(34d)$ holds when the widths of the low-concentration P-RESURF layers 11b, 32d, 33d, and 34d in the RESURF layer 31 are represented by $w(11b)$, $w(32d)$, $w(33d)$, and $w(34d)$, respectively, and the widths of the non-implantation N-regions 32c, 33c, and 34c are represented by $w(32c)$, $w(33c)$, and $w(34c)$, respectively.

The rate of the widths of the low-concentration P-RESURF layers 11b, 32d, 33d, and 34d is $w(11b):w(32d):w(33d):w(34d)=1:1-x:1-2x:1-3x$, and the rate of the widths of the non-implantation N-regions 32c, 33c, and 34c is $w(32c):w(33c):w(34c)=x:2x:3x$. Note that x satisfies $0<x<1/3$.

The rate at which the widths of the low-concentration P-RESURF layers become smaller and the rate at which the widths of the non-implantation N-regions become larger are made identical to each other in this manner, whereby the virtual stage widths of implantation amounts can be made uniform. This results in a uniform rate at which the amounts of implantations to the RESURF layers gradually decrease.

Figure 21:
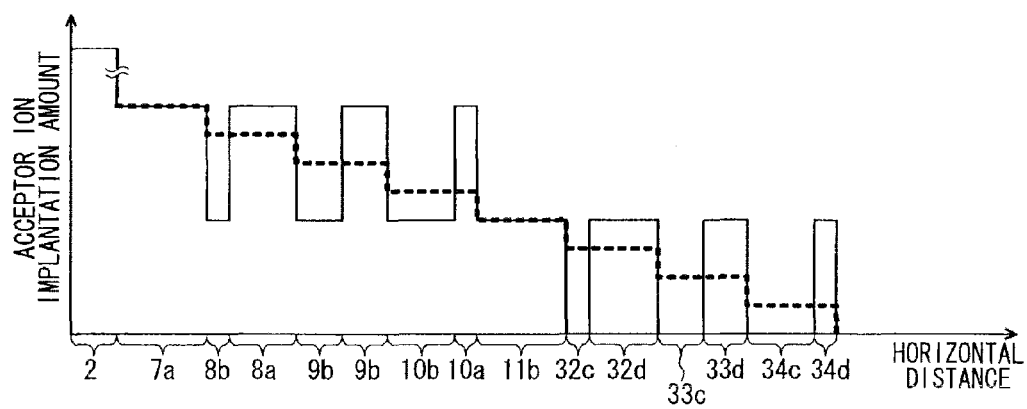
FIG. 21 A diagram showing a horizontal distribution of an amount of implantation to a RESURF layer in the semiconductor device according to the third embodiment of the present invention.

The implantation amounts of the acceptor ions (impurities) in the RESURF layer 31 are shown in graph form in FIG. 21, where the horizontal axis and the vertical axis represent a distance in the horizontal direction of the semiconductor substrate and an implantation amount, respectively. Here, $x=1/4$.

As indicated by the solid line in FIG. 21, the implantation amounts of P-type impurities are smaller than those of the P-base layer 2 in the regions corresponding to the high-concentration P-RESURF layers 7a, 8a, 9a, and 10a but are larger than those of the low-concentration P-RESURF layers 8b, 9b, 10b, and 11b.

The implantation amounts of P-type impurities are smaller than those of the high-concentration P-RESURF layers in the regions corresponding to the low-concentration P-RESURF layers 11b, 32d, 33d, and 34d but are higher than those of the non-implantation N-regions 32c, 33c, and 34c. The non-implantation N-regions 32c, 33c, and 34c are regions as the semiconductor substrate 1 per se containing a relatively low concentration (N) of N-type impurities, and thus, an amount of P-type impurities is zero if the diffusion of implanted P-type impurities is not taken into consideration.

Implantation amounts are averaged for the set of the adjacent low-concentration P-RESURF layer and high-concentration P-RESURF layer and for the set of the adjacent non-implantation N-region and low-concentration P-RESURF layer, so that a stepwise implantation amount distribution as indicated by the broken line in FIG. 21 is obtained.

Assuming the amount of implantation to the high-concentration P-RESURF layer 7a as a first stage, an average of the amounts of implantations to the low-concentration P-RESURF layer 8b and high-concentration P-RESURF layer 8a is a second stage, an average of the amounts of implantations to the low-concentration P-RESURF layer 9b and high-concentration P-RESURF layer 9a is a third stage, an average of the amounts of implantations to the low-concentration P-RESURF layer 10b and high-concentration P-RESURF layer 10a is a fourth stage, and the amount of implantation to the low-concentration P-RESURF layer 11b is a fifth stage. An average of the amounts of implantations to the non-implantation N-region 32c and low-concentration P-RESURF layer 32d is a sixth stage, an average of the amounts of implantations to the non-implantation N-region 33c and low-concentration P-RESURF layer 33d is a seventh stage, and an average of the amounts of implantations to the non-implantation N-region 34c and low-concentration P-RESURF layer 34d is an eighth stage.

Assuming in FIG. 21 that the high-concentration P-RESURF layer 7a forms a set with a low-concentration P-RESURF layer whose width is zero and that the low-concentration P-RESURF layer 11b forms a set with a high-concentration P-RESURF layer whose width is zero, a virtual number of gradations (number of stages) of implantation amounts is determined by the repetition number of sets each including a low-concentration P-RESURF layer and a high-concentration P-RESURF layer and the repetition number of sets each including a non-implantation N-region and a low-concentration P-RESURF layer. The RESURF layer 31 accordingly becomes a RESURF layer having virtual eight stages of implantation amounts in the substrate horizontal direction.

The amount of implantation to the low-concentration P-RESURF layer is desirably 0.6 to 0.9 times the RESURF condition. The amount of implantation to the high-concentration P-RESURF layer is desirably 1.5 to 2.5 times that of the low-concentration P-RESURF layer, though depending on the amount of implantation to the low-concentration P-RESURF layer.

As described above, in the PIN diode 300, the set of a low-concentration P-RESURF layer and a non-implantation N-region can set a virtual implantation amount, whereby the amount of implantation to the low-concentration P-RESURF layer can be increased compared with the first embodiment in which the P-RESURF layer 3 alone has the breakdown voltage structure. Increasing the amount of implantation to the low-concentration P-RESURF layer alleviates the influence due to variations in implantation amount.

Figure 22:
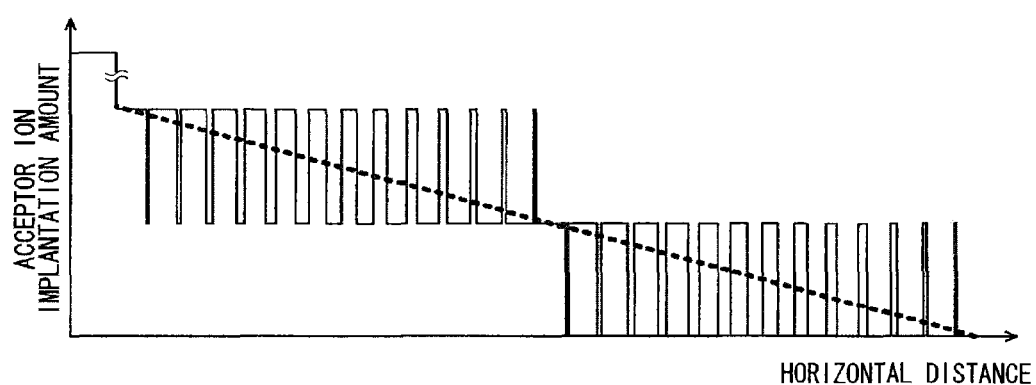
FIG. 22 A diagram showing a horizontal distribution of an amount of implantation to the RESURF layer in the semiconductor device according to the third embodiment of the present invention.

If the number of repetitions of the set (referred to as set A) of a low-concentration P-RESURF layer and a high-concentration P-RESURF layer and the set (referred to as set B) of a non-implantation N-region and a low-concentration P-RESURF layer are further increased, a difference in implantation amount between the sets becomes smaller, resulting in a RESURF layer whose implantation amount gradually decreases linearly to zero in a virtual manner, as indicated by the broken line in FIG. 22. In FIG. 22, the horizontal axis and the vertical axis represent a distance in the horizontal direction of the substrate and an implantation amount, respectively.

Increasing the number of repetitions of set A and set B allows the implantation amounts to gradually decrease linearly in a nearly ideal manner. Thus, the electric field inside the semiconductor substrate can be reduced further, in other words, a higher breakdown voltage can be obtained.

Figure 23:
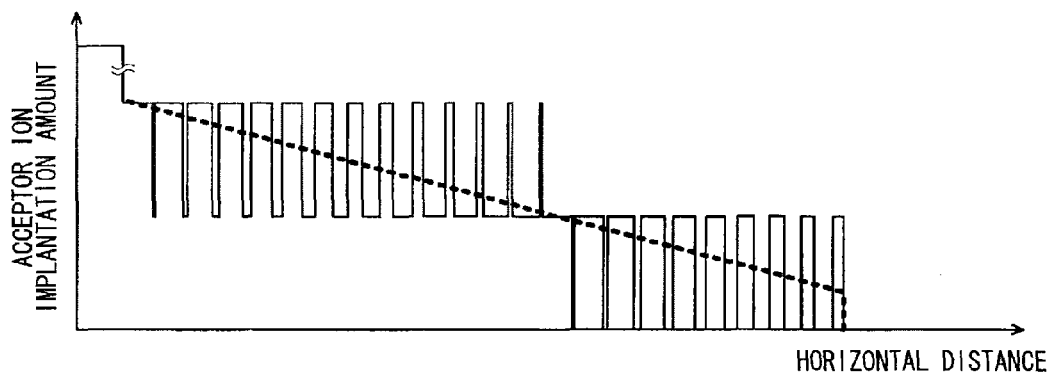
FIG. 23 A diagram showing another example of the horizontal distribution of the amount of implantation to the RESURF layer in the semiconductor device according to the third embodiment of the present invention.

Although FIG. 22 shows the configuration of such a RESURF layer that implantation amounts gradually decrease to zero in a virtual manner, an implantation amount may gradually decrease to a certain value, as shown in FIG. 23. In this case, the width of the set of a non-implantation N-region and a low-concentration P-RESURF layer is set such that the implantation amount at the outermost edge of the RESURF layer is about 0.3 to 0.6 times the RESURF condition. A virtual implantation amount, which is about 0.3 to 0.6 times the RESURF condition, to the outermost edge of the RESURF layer normally obtains an excellent breakdown voltage even with a relatively small number of repetitions.

Figure 24:
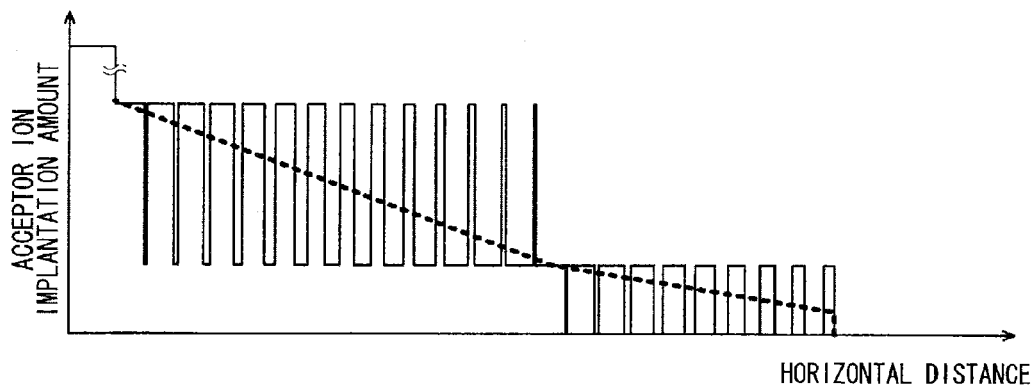
FIG. 24 A diagram showing another example of the horizontal distribution of the amount of implantation to the RESURF layer in the semiconductor device according to the third embodiment of the present invention.
Figure 25:
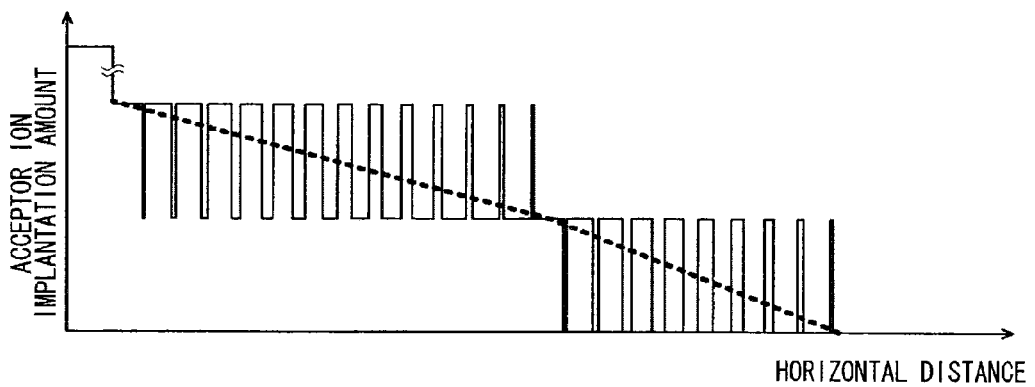
FIG. 25 A diagram showing another example of the horizontal distribution of the amount of implantation to the RESURF layer in the semiconductor device according to the third embodiment of the present invention.

With reference to FIGS. 22 and 23, the set A and the set B are configured such that the slope of a straight line at which implantation amounts gradually decrease is the same between inside (region formed of a plurality of sets A) as well as outside (region formed of a plurality of sets B) of the RESURF layer. Alternatively, a gradually decreasing pattern may be such a pattern with vertex down that the descending slope of an inner line is steeper than the descending slope of an outer line as shown in FIG. 24. Or, a gradually decreasing pattern may be such a pattern with vertex up that the descending slope of an inner line is gentler than the descending slope of an outer line as shown in FIG. 25. The virtual implantation amount needs not to change linearly in a precise manner. The horizontal axis and the vertical axis of FIGS. 23 to 25 represent a distance in the horizontal of the substrate and an implantation amount, respectively.

The RESURF layer 31 shown in FIG. 20 is configured such that the widths of the sets A are made uniform, the widths of the sets B are made uniform, the widths of the low-concentration P-RESURF layers are gradually increased toward the outside and the widths of the high-concentration P-RESURF layers are gradually decreased toward the outside in the sets A, and the widths of the non-implantation N-regions are gradually increased toward the outside and the widths of the low-concentration P-RESURF layers are gradually decreased toward the outside in the sets B. This configuration leads to a well-balanced configuration in terms of high breakdown voltage resistance, robustness against process errors, and robustness against an operating environment of a semiconductor device if the number of repetitions of the sets A and B are small.

If the amount of implantation to the high-concentration P-RESURF layer is twice the amount of implantation to the low-concentration P-RESURF layer, a well-balanced configuration can be obtained by setting the width of the set A and the width of the set B to be identical to each other.

For the sake of convenience, the PIN diode 300 shown in FIG. 20 has a configuration including the additional RESURF layer 32 including a plurality of low-concentration P-RESURF layers formed in adjacent to the P-RESURF layer 3, which are formed in adjacent each other, and the RESURF layer 31 is configured to have a width larger than that of the P-RESURF layer 3 of FIG. 3. The RESURF layer 31, however, needs not to have a width larger than that of the P-RESURF layer 3 of FIG. 3. If the virtual implantation amounts change similarly between the both layers, the P-RESURF layer 3 of FIG. 3 and the RESURF layer 31 may have the same width. In this case, the widths of the sets included in the RESURF layer 31 become smaller.

<C-2. Manufacturing Method>

Figure 26:
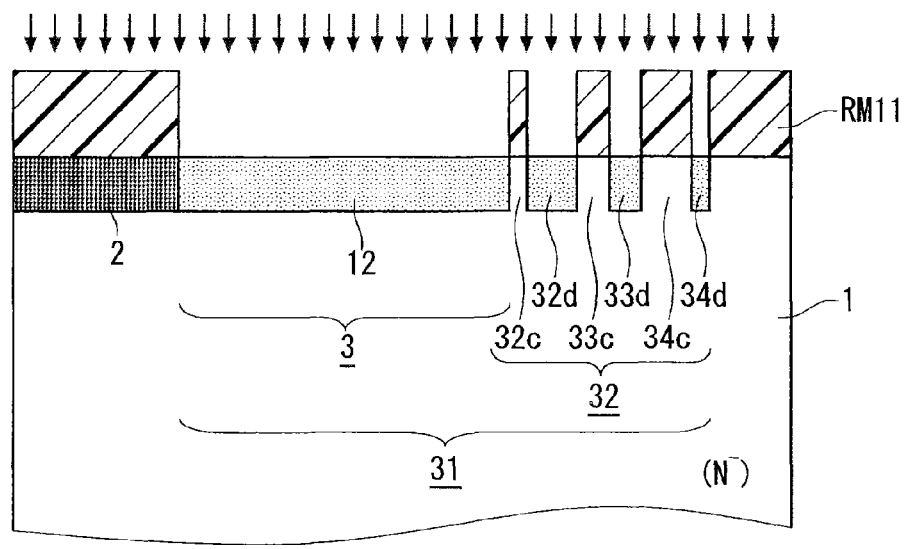
FIG. 26 A cross-sectional view describing the step of manufacturing the RESURF layer of the semiconductor device according to the third embodiment of the present invention.
Figure 27:
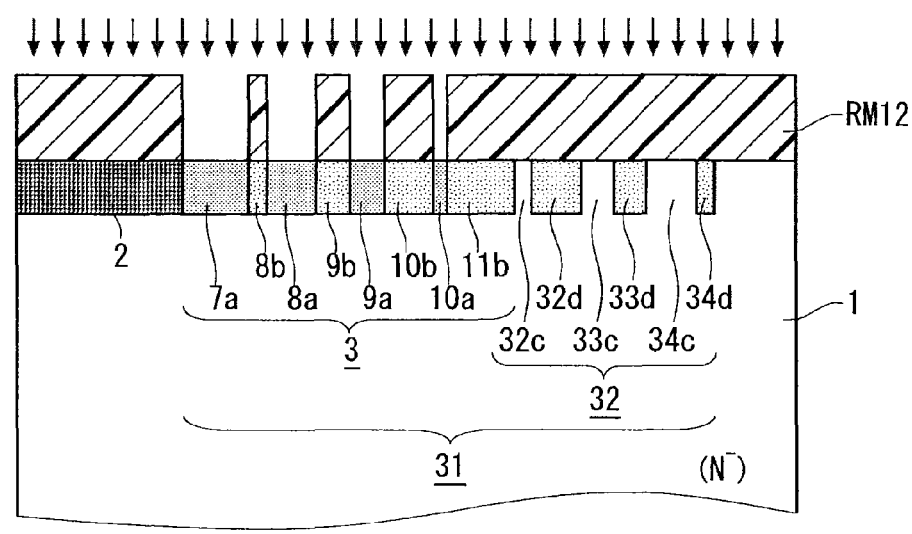
FIG. 27 A cross-sectional view describing the step of manufacturing the RESURF layer of the semiconductor device according to the third embodiment of the present invention.

Next, the method of manufacturing the RESURF layer 31 will be described with reference to FIGS. 26 and 27 showing the steps of manufacturing the RESURF layer 31 in order.

As shown in FIG. 26, the P-base layer 2 containing a relatively high concentration of P-type impurities is formed in the front surface of one main surface of the semiconductor substrate 1 containing a relatively low concentration (N) of N-type impurities. Then, a resist mask RM11, which has such a pattern that the portion corresponding to the region in which the P-RESURF layer 3 is formed and the portions corresponding to the low-concentration P-RESURF layers 32d, 33d, and 34d are openings, is formed on this one main surface.

Then, acceptor ions (P-type impurity ions) are implanted such that the implantation amount corresponding to the low-concentration P-RESURF layer from above the resist mask RM11 is obtained. This forms the low-concentration P-type impurity layer 12 in the entire region in which the P-RESURF layer 3 is formed and also forms the low-concentration P-RESURF layers 32d, 33d, and 34d.

Then, the resist mask RM11 is removed and, in the step shown in FIG. 27, a resist mask RM12, which has such a pattern that the portions corresponding to the high-concentration P-RESURF layers 7a, 8a, 9a, and 10a are openings, is formed. Then, acceptor ions are implanted from above the resist mask RM12 such that an implantation amount corresponding to a difference amount between the implantation amount corresponding to the high-concentration P-RESURF layer and the implantation amount corresponding to the low-concentration P-RESURF layer is obtained. As a result, the high-concentration P-RESURF layers 7a, 8a, 9a, and 10a are formed through the openings. In the portions that have been covered with the resist mask RM12, the low-concentration P-RESURF layers 8b, 9b, 10b, and 11b are formed, and the non-implantation N-regions 32c, 33c, and 34c are defined.

As described above, the RESURF layer 31 having multiple stages of implantation amounts can be formed virtually through two photolithography processes and two impurity implantation processes, which enables to obtain a semiconductor device having high robustness against process errors such as an alignment error and a mask dimensional error.

Although the P-base layer 2 is formed and then the RESURF layer 31 is formed in the manufacturing method described with reference to FIGS. 26 and 27, those layers may be formed in a reverse order.

The first implantation of acceptor ions and the second implantation of acceptor ions may be performed in a reverse order.

<C-3. Effects>

Next, the effects achieved in a case where the semiconductor device according to the third embodiment of the present invention is applied to a vertical Si PIN diode having a 4500 V breakdown voltage class will be described with reference to FIGS. 28 to 33, 35, and 36 showing the simulation results. The following description is based on the configuration in which the set A and the set B are repeated 12 times in total.

Figure 28:
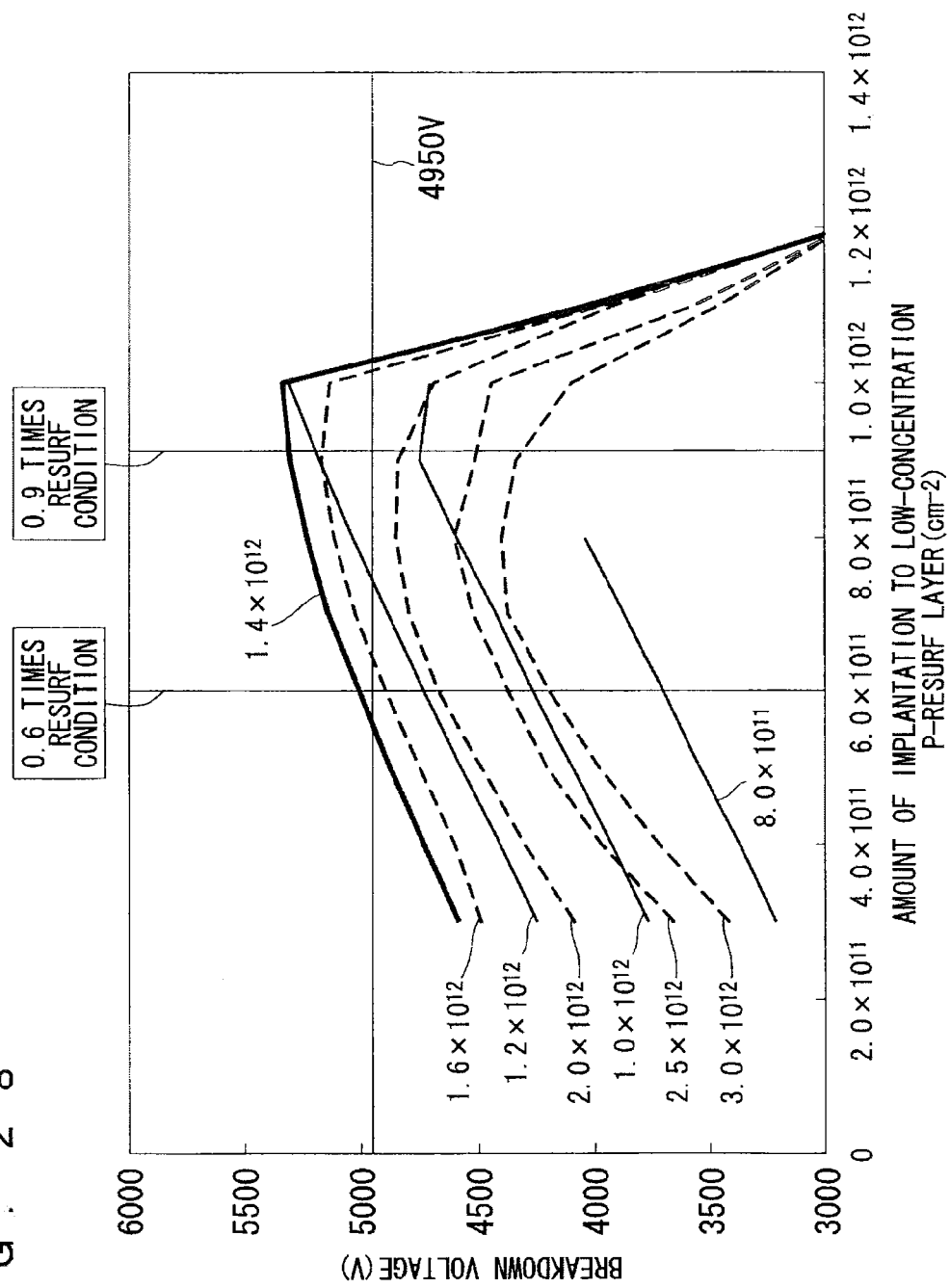
FIG. 28 A diagram showing the dependence of a breakdown voltage on an amount of implantation in the RESURF layer of the semiconductor device according to the third embodiment of the present invention.

FIG. 28 shows the dependence of the breakdown voltage on the RESURF layer implantation amount examined at room temperature, which shows breakdown voltage characteristics where the horizontal axis and the vertical axis represent a low-concentration P-RESURF layer implantation amount ($cm^{-2}$) and a breakdown voltage (V), respectively, and the implantation amounts ($cm^{-2}$) of the high-concentration P-RESURF layers are taken as parameters.

FIG. 28 shows breakdown voltage characteristics when the amount of implantation to the high-concentration P-RESURF layer is $8.0 \times 10^{11}$, $1.0 \times 10^{12}$, $1.2 \times 10^{12}$, $1.4 \times 10^{12}$, $1.6 \times 10^{12}$, $2.0 \times 10^{12}$, $2.5 \times 10^{12}$, and $3.0 \times 10^{12}$.

The highest breakdown voltage can be obtained in a case where the amount of implantation to the high-concentration P-RESURF layer, which is indicated by the thick line in FIG. 28, is $1.4 \times 10^{12}$ cm$^{-2}$, and thus, this implantation amount is referred to as an optimum implantation amount. Meanwhile, the characteristics indicated by the solid lines show the characteristics for implantation amounts lower than the optimum implantation amount, and the characteristics indicated by the broken lines show the characteristics of implantation amounts higher than the optimum implantation amount.

FIG. 28 shows that in consideration of process errors, high breakdown voltage characteristics can be obtained stably in a case where the amount of implantation to the high-concentration P-RESURF layer is about 1.2 to 1.6 times the RESURF condition and the amount of implantation to the low-concentration P-RESURF layer is 0.6 to 0.9 times the RESURF condition.

Here, "high breakdown voltage" is defined as a rated voltage+10% (4500V+10%=4950 V) at room temperature, and "stable high breakdown voltage characteristics" are defined as such characteristics that a breakdown voltage of 4950 V can be obtained even if the amount of implantation to the low-concentration P-RESURF layer deviates by 10%. This is because the breakdown voltage in the RESURF structure according to the present invention is more likely to be affected by the amount of implantation to the low-concentration P-RESURF layer than by the amount of implantation to the high-concentration P-RESURF layer.

With reference to FIG. 28, the condition for obtaining a breakdown voltage of 4950 V even if the amount of implantation to the low-concentration P-RESURF layer deviates by ±10% is a case in which the amount of implantation to the high-concentration P-RESURF layer is 1.2 to 1.6 times ($1.2 \times 10^{12}$ to $1.6 \times 10^{12}$ cm$^{-2}$) the RESURF condition ($1 \times 10^{12}$ cm$^{-2}$).

The margin for an amount of implantation to the low-concentration P-RESURF layer is maximized when the amount of implantation to the high-concentration P-RESURF layer is $1.4 \times 10^{12}$ cm$^{-2}$. For the breakdown voltage characteristics in that case, even if an amount of implantation to the low-concentration P-RESURF layer deviates by ±10%, a breakdown voltage of 4950 V can be obtained as long as the implantation amount is within the range of 0.6 to 0.9 times the RESURF condition ($6\times10^{11}$ to $9\times10^{11} cm^{-2}$). This results in about 1.5 to 2.5 in the ratio of the amounts of implantations to the high-concentration P-RESURF layer and the low-concentration P-RESURF layer.

Figure 29:
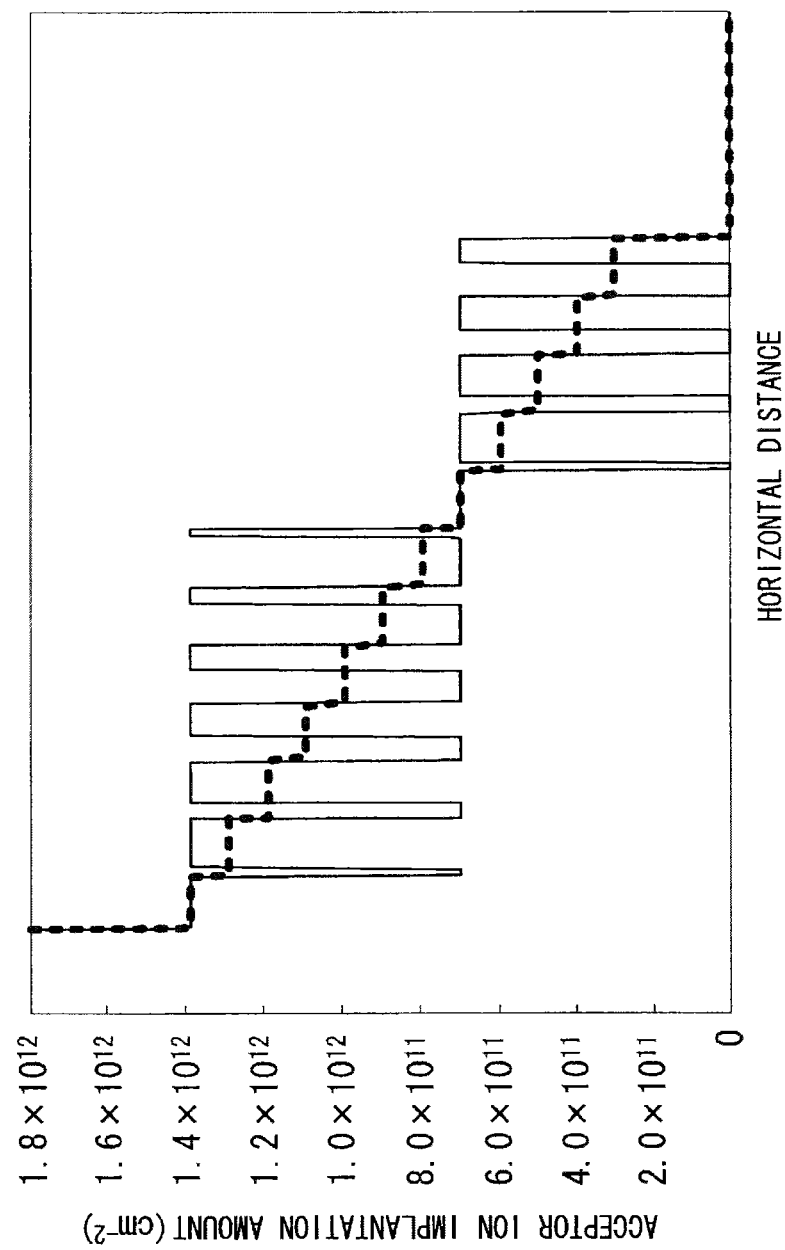
FIG. 29 A diagram showing a horizontal distribution of an amount of implantation to the RESURF layer of the semiconductor device according to the third embodiment of the present invention.

FIG. 29 shows an example of the implantation amount of acceptor ions in a case where the set A and set B is repeated 12 times in total, where the horizontal axis represents a distance in the plane direction (horizontal direction) of the P-base layer, RESURF layer, or low-concentration N-type semiconductor substrate, and the vertical axis represent an implantation amount ($cm^{-2}$).

A RESURF layer as shown in FIG. 29 is obtained, which has eight repetitions of the set A including the low-concentration P-RESURF layer having an implantation amount of $7\times10^{11}$ $cm^{-2}$ and the high-concentration P-RESURF layer having an implantation amount of $1.4\times10^{12}$ $cm^{-2}$, including the set A in which the width of one of the layers is zero, which has four repetitions of the set B including the non-implantation N-region and the low-concentration P-RESURF layer, and which has virtual 12 stages of implantation amounts as indicated by the broken line. The simulation results on the RESURF layer having virtual 12 stages of implantation amounts will be described with reference to FIGS. 30 to 33.

FIG. 30 shows an electric field intensity (V/cm) on the front surface of the main surface (uppermost surface of the RESURF layer) of the semiconductor substrate on a reverse voltage of 4500 V, where the horizontal axis and the vertical axis represent a distance in the horizontal direction and an electric field intensity (V/cm), respectively.

FIG. 31 shows a potential (V) on the front surface of the main surface of the semiconductor substrate on a reverse voltage of 4500 V, where the horizontal axis and the vertical axis represent a distance in the horizontal direction and a potential (V), respectively.

Figure 32:
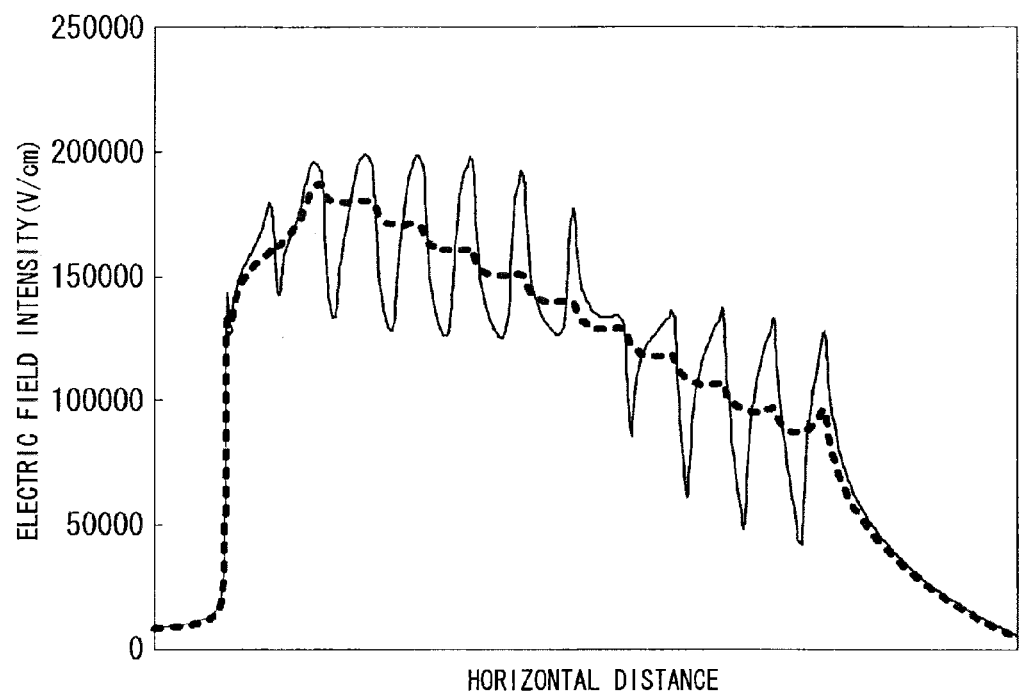
FIG. 32 A diagram showing simulation results on the electric field intensity in the semiconductor device according to the third embodiment of the present invention.

FIG. 32 shows an electric field intensity (V/cm) at the depth (PN junction depth) corresponding to the implantation depth of the RESURF layer on a reverse voltage of 4500 V, where the horizontal axis and the vertical axis represent a distance in the plane direction and an electric field intensity (V/cm), respectively. The most intense electric field concentration occurs near the portion at the implantation depth of the RESURF layer in the semiconductor substrate.

Figure 33:
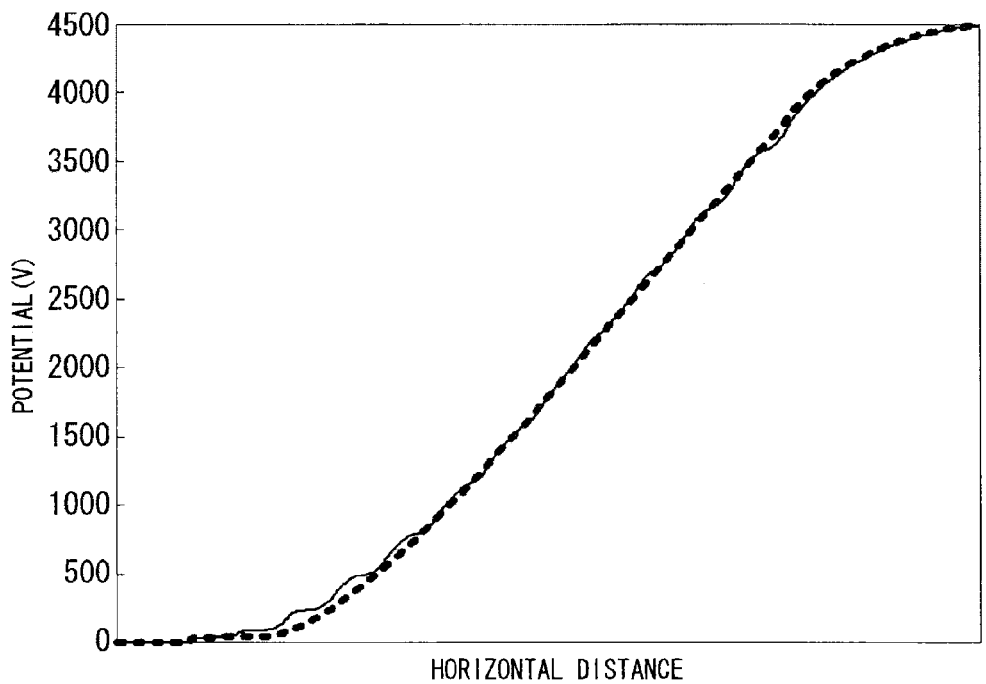
FIG. 33 A diagram showing simulation results on the potential in the semiconductor device according to the third embodiment of the present invention.

FIG. 33 shows a potential (V) at the depth (PN junction depth) corresponding to the implantation depth of the RESURF layer on a reverse voltage of 4500 V, where the horizontal axis and the vertical axis represent a distance in the horizontal direction and a potential (V), respectively.

FIGS. 30 and 32 show the comparison results of electric fields between the structure of the RESURF layer having virtual 12 stages of implantation amounts according to the present invention, as indicated by the broken line of FIG. 29, and the structure of the P-RESURF layer actually formed to have 12 stages of implantation amounts (12-stage implantation structure). FIGS. 31 and 33 show comparison of potentials.

In FIGS. 30 to 33, the solid lines correspond to the simulation results on the structure of the RESURF layer according to the present invention, and the broken lines correspond to the simulation results on the structure of the P-RESURF layer having the 12-stage implantation structure.

FIG. 30 reveals that the electric field intensity of the RESURF layer according to the present invention has a peak value about twice as high as that of the 12-stage implantation structure, and that if the electric field intensities are averaged such that the peak of the electric field fills the dip of thereof in the set of the adjacent low-concentration P-RESURF layer and high-concentration P-RESURF layer and in the set of the adjacent non-implantation N-region and low-concentration P-RESURF layer, the distribution close to the electric field intensity distribution of the 12-stage implantation structure can be obtained in the portions except for both ends.

This results in that as shown in FIG. 31, the potential distributions become extremely close to each other between the RESURF layer according to the present invention and the P-RESURF layer having the 12-stage implantation structure. The potentials of them change substantially linearly to the distance, which is ideal for the breakdown voltage structure. This holds true for FIGS. 32 and 33 showing an electric field intensity and a potential at the depth corresponding to the implantation depth of the RESURF layer, respectively.

The comparison between FIGS. 30 and 32 and FIGS. 11 and 13 according to the first embodiment shows that a peak electric field intensity is reduced more than the first embodiment.

As described above, the semiconductor device according to the third embodiment can reduce an electric field inside a semiconductor substrate more than the semiconductor device according to the first embodiment.

The maximum electric field inside the semiconductor substrate in the RESURF layer according to the third embodiment is about 6% higher than that of the P-RESURF layer having the 12-stage implantation structure.

The comparison between FIG. 31 and FIG. 33 and FIGS. 12 and 14 according to the first embodiment shows that a potential distribution also becomes closer to that of the P-RESURF layer having the 12-stage implantation structure than the first embodiment.

As the reason for the above, it is conceivable that compared with the P-RESURF layer according to the first embodiment, the RESURF layer according to the third embodiment can reduce a concentration difference in impurity at a boundary between the regions having different implantation amounts, to thereby relax an electric field further.

It is also conceivable that compared with the P-RESURF layer according to the first embodiment, the RESURF layer according to the third embodiment can reduce a difference in local implantation amount with the P-RESURF layer having the 12-stage implantation structure.

The above is the reason why the case in which the potential distribution becomes extremely close to that of the P-RESURF layer having the 12-stage implantation structure in FIGS. 31 and 33. It could be said that the RESURF layer according to the third embodiment has a configuration more similar to that of the P-RESURF layer having the 12-stage implantation structure than the P-RESURF layer according to the first embodiment.

The same description holds true for the case in which only the sets each including a high-concentration P-RESURF layer and a non-implantation N-region form a P-RESURF layer whose implantation amounts gradually decrease virtually. Advantageously, the above-mentioned configuration can further reduce each of the photolithography processes and impurity implantation processes by one.

In actuality, only the set of a high-concentration P-RESURF layer and a non-implantation N-region can form a P-RESURF layer whose implantation amounts gradually decrease in a virtual manner, which still has problems in the maximum electric field intensity and breakdown voltage.

Here, FIG. 34 shows as a table, for a vertical Si PIN diode of 4500 V breakdown voltage class, the simulation results obtained through comparison of the maximum electric field intensity and breakdown voltage inside a semiconductor among the RESURF layers according to the first and third embodiments and the RESURF layers having reference structures.

A reference structure 1 refers to the P-RESURF layer having the 12-stage implantation structure, and a reference structure 2 refers to the P-RESURF layer whose implantation amount gradually decreases virtually, which is formed of only the sets each including a high-concentration P-RESURF layer and a non-implantation N-region. The conditions including the width of the entire RESURF layer are the same except for the distribution of an implantation amount in the RESURF layer.

It can be seen as shown in FIG. 34 that a breakdown voltage tends to become higher as a maximum electric field intensity becomes lower, though the breakdown voltage of the RESURF layer according to the third embodiment exceeds that of the P-RESURF layer having the 12-stage implantation structure. Although the electric field intensity is not only the element that determines a breakdown voltage, a lower maximum electric field intensity means a larger margin for a dielectric breakdown electric field.

If the margin for a dielectric breakdown electric field is larger than necessary, the size of the RESURF layer may be reduced in place of reducing this margin. This reduces the size of the termination structure or breakdown voltage structure, resulting in a reduction in the chip area of a semiconductor device (semiconductor chip). This means an increase in the number of semiconductor chips obtained per wafer, meaning that the manufacturing cost per chip can be reduced.

<C-4. Modifications>

While the description has been given assuming that the present invention has an effect of relaxing an electric field inside a semiconductor, the present invention also has an effect of reducing an electric field outside the semiconductor. The effect of reducing an electric field outside the semiconductor becomes conspicuous in a case where an amount of implantation to a high-concentration P-RESURF layer is set higher. This will be described below with reference to FIGS. 35 and 36.

Figure 35:
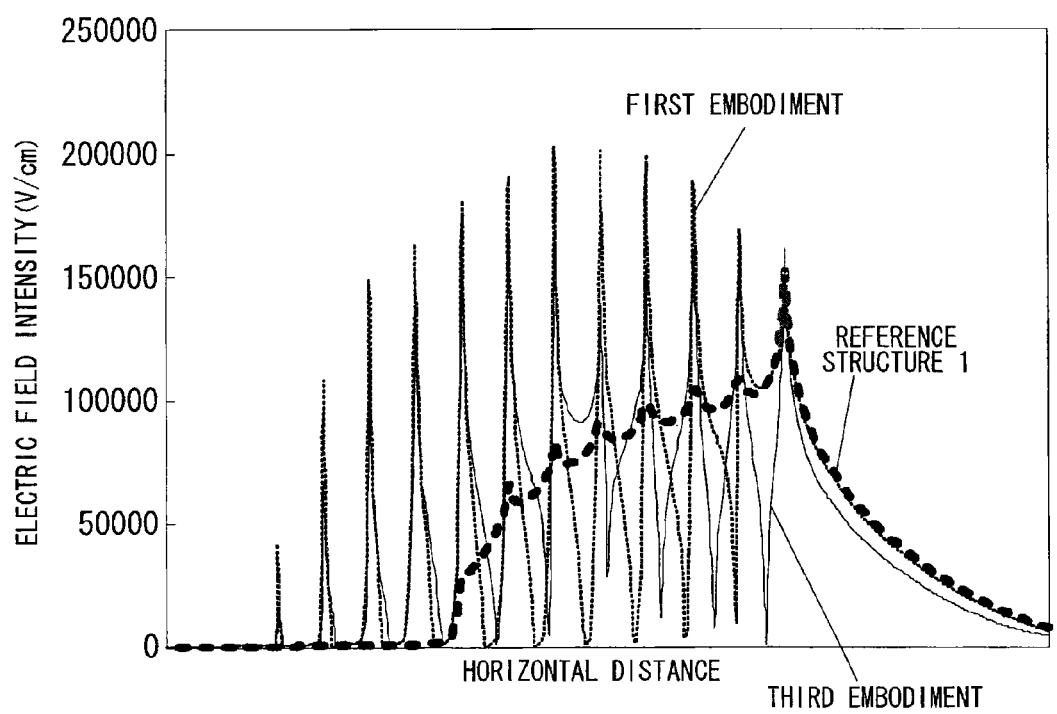
FIG. 35 A diagram showing simulation results of the semiconductor devices according to the first and third embodiments of the present invention.
Figure 36:
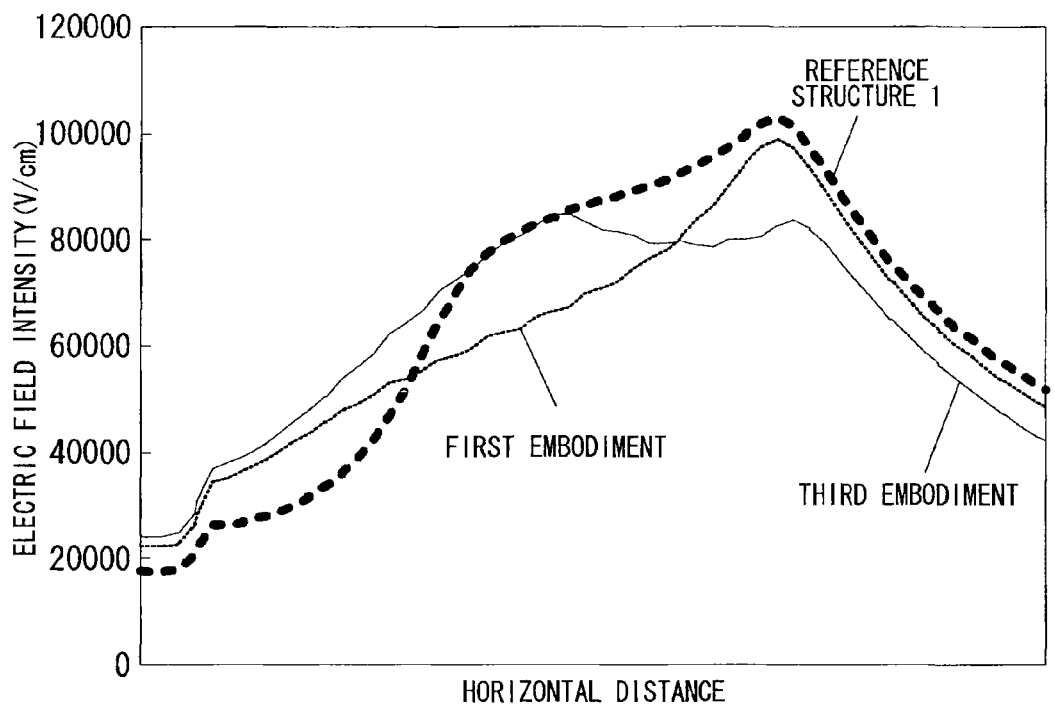
FIG. 36 A diagram showing simulation results on the semiconductor devices according to the first and third embodiments of the present invention.

FIGS. 35 and 36 show the simulation results in cases where the semiconductor devices of the first and third embodiments are applied to a vertical Si PIN diode of 4500 V breakdown voltage class.

Here, the amount of implantation to a low-concentration P-RESURF layer has the optimum value described above, whereas the amount of implantation to a high-concentration P-RESURF layer is set twice the RESURF condition, which is somewhat higher.

If the amount of implantation to a P-base layer is larger than that to the high-concentration P-RESURF layer by one or more digits or if the depth of the P-base layer is much larger than that of the high-concentration P-RESURF layer, an electric field is concentrated intensely at the edge of the P-base layer. In such a case, an electric field at the edge of the P-base layer can be relaxed by setting an amount of implantation to the high-concentration P-RESURF layer to be somewhat higher.

Assuming that the front surface of the termination structure (breakdown voltage structure) is protected with a thick passivation resin layer, an electric field outside the semiconductor is defined as an electric field on the front surface of the passivation resin layer. A higher electric field outside the semiconductor leads to a higher probability that a surface discharge will tend to occur between an anode electrode and an end of the semiconductor device (end of the semiconductor chip). The generation of a surface discharge causes an electrical short-circuit between the anode electrode and the cathode electrode, which is inconvenient for a semiconductor device and an electrical circuit (such as a semiconductor device module) including a semiconductor device incorporated therein.

FIG. 35 shows an electric field intensity on the front surface of the main surface of the substrate on a reverse voltage of 4500 V, where the horizontal axis and the vertical axis represent a distance in the horizontal direction of the substrate and an electric field intensity (V/cm), respectively.

FIG. 36 shows an electric field intensity on the front surface of the passivation resin layer on a reverse voltage of 4500 V, where the horizontal axis and the vertical axis represent a distance in the horizontal direction of the substrate and an electric field intensity (V/cm), respectively.

In FIGS. 35 and 36, the thin broken line, the thin solid line, and the thick broken line indicate the simulation results of the first embodiment, the simulation results of the third embodiment, and the simulation results on the P-RESURF layer (reference structure 1) having the 12-stage implantation structure, respectively. As in the first and third embodiments, the P-RESURF layer of the reference structure 1 is set such that the amount of implantation to the innermost (on the P-base layer side) high-concentration P-RESURF layer is twice the RESURF condition.

As shown in FIG. 35, for the P-RESURF layer of the reference structure 1, an inner region having a relatively large implantation amount is not depleted up to the front surface, and accordingly, the electric field on the front surface of the semiconductor becomes nearly zero in this region. Meanwhile, in the first and third embodiments, the low-concentration P-RESURF layer is depleted up to the front surface, and accordingly, an electric field on the front surface of the semiconductor is generated also in the inner region. In other words, it is shown that in the first and third embodiments, an electric field is generated in more dispersed locations on the front surface of the semiconductor.

This results in that as shown in FIG. 36, in the first and third embodiments, the peak value of an electric field on the front surface of the passivation resin layer is reduced more than that of the semiconductor device including the P-RESURF layer of the reference structure 1. That is, the semiconductor devices of the first and third embodiments have a more excellent electric field on the front surface of the passivation resin layer than the semiconductor device including the P-RESURF layer of the reference structure 1.

Particularly in the third embodiment, when an amount of implantation to the high-concentration P-RESURF layer is increased, the electric field on the front surface of the passivation resin layer reaches its peak above portions of the places in which the set A of a low-concentration P-RESURF layer and a high-concentration P-RESURF layer is provided and the places in which the set B of a non-implantation N-region and a low-concentration P-RESURF layer is provided.

This is because the slope of the virtual amount of implantation to the place in which the set A of a low-concentration P-RESURF layer and a high-concentration P-RESURF layer is provided differs from the slope of the virtual amount of implantation to the place in which the set B of a non-implantation N-region and a low-concentration P-RESURF layer is provided.

Design is made such that those two peaks have a similar height, so that the peak value of the electric field on the front surface of the passivation resin layer can be reduced significantly, as shown as the characteristics of the third embodiment shown in FIG. 36.

FIGS. 35 and 36 merely show examples. In any of the first and third embodiments, the peak of the electric field on the front surface of the passivation resin layer can be reduced further by changing the width of each implantation layer in a non-linear manner and appropriately designing a change of the virtual amount of implantation.

<D. Fourth Embodiment>

Although the first and third embodiments have described the cases in which the present invention is applied to a PIN diode, the present invention is also applicable to a vertical MOSFET and a vertical IGBT that include a P-type implantation layer (P-well) containing a relatively high concentration of P-type impurities, as well as to a Schottky barrier diode.

Figure 37:
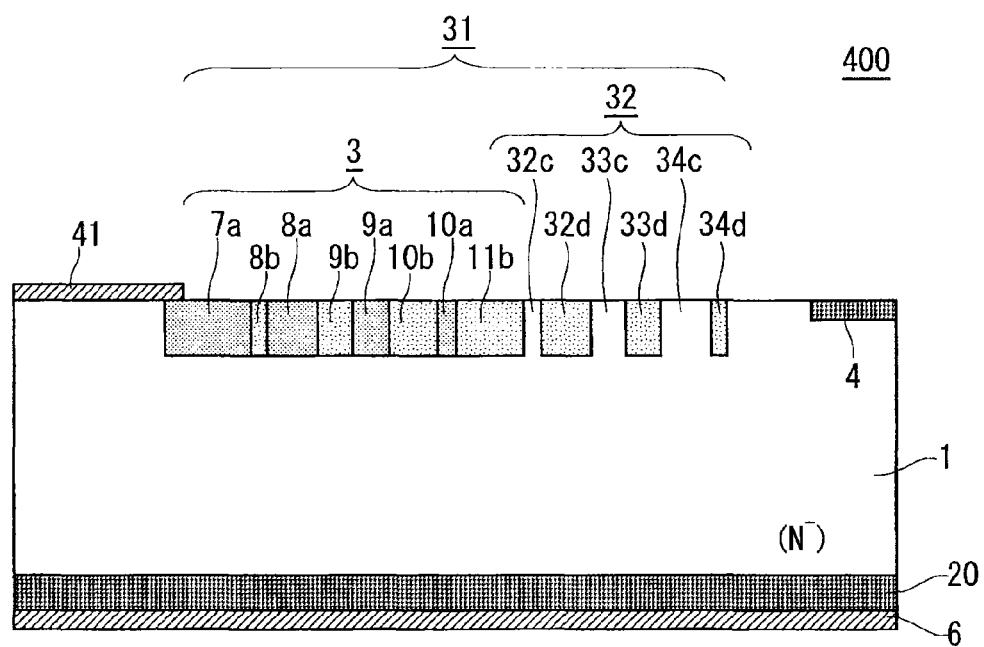
FIG. 37 A cross-sectional view showing a configuration of a semiconductor device according to a fourth embodiment of the present invention.

FIG. 37 is a partial cross-sectional view showing the configuration of a Schottky barrier diode 400 in a case where the present invention is applied to a Schottky barrier diode. The same references denote the same components as those of the PIN diode 300 shown in FIG. 20, and redundant description will not be given.

The Schottky barrier diode 400 shown in FIG. 37 is formed on the semiconductor substrate 1 containing a relatively low concentration of N-type impurities, and a RESURF layer 31 is formed such that a high-concentration P-RESURF layer 7a extends up to the portion below the end of a Schottky electrode 41 provided on the main surface of the semiconductor substrate 1.

The Schottky barrier diode 400 needs an overlap between the Schottky electrode 41 and the high-concentration P-RESURF layer 7a to protect the end of the Schottky electrode 41. Note that an electric field is concentrated on the inner end of the high-concentration P-RESURF layer 7a, and thus, the overlap between the Schottky electrode 41 and the high-concentration P-RESURF layer 7a is desirably provided for several μm or more to prevent an electric field concentration from affecting the portion below the end of the Schottky electrode 41. The width of the high-concentration P-RESURF layer 7a may be increased by the amount of this overlap.

The inclusion of the above-mentioned RESURF layer 31 leads to a Schottky barrier diode having high breakdown voltage resistance.

The Schottky barrier diode is typically provided with a P-type implantation layer containing a high concentration of P-type impurities in the portion below the end of the Schottky electrode to relax an electric field concentration in the end of the Schottky electrode.

However, it is not necessary to provide an additional P-type implantation layer if the high-concentration P-RESURF layer 7a extends up to the portion below the end of the Schottky electrode 41 and the amount of implantation to the high-concentration P-RESURF layer 7a is 1.5 or more times the value given on the RESURF condition of a semiconductor material. This advantageously simplifies the manufacturing steps.

In forming the RESURF layer 31, P-type impurities may be implanted also to part of the portion (active region) below the Schottky electrode 41 to form a junction barrier Schottky diode (JBS).

The JBS has a configuration in which P-type implantation layers containing a relatively high concentration of P-type impurities and non-implantation N-regions are provided alternately in a semiconductor layer (N⁻) located below the Schottky electrode 41. The JBS is also referred to as a merged PN-Schottky diode (MPS).

<E. Other Application Examples>

While the first to fourth embodiments above have described the semiconductor devices in which the conductivity types of the semiconductor substrate and the implantation layer are limited to a P type or an N type, similar effects can be achieved if those conductivity types are all opposite.

While the first to fourth embodiments have described and shown that the implantation layers all have the same depth, effects of the present invention can be achieved if every implantation layer has any depth.

For example, like a PIN diode 500 shown in FIG. 38, an exemplary modification of the first embodiment may have such a configuration that a high-concentration P-RESURF layer 51 is deeper than a low-concentration P-RESURF layer 52.

As another example, like a PIN diode 501 shown in FIG. 39, a low-concentration P-RESURF layer 54 may include a high-concentration P-RESURF layer 53 therein. Note that what is important for the termination structure and the breakdown voltage structure is an implantation amount, that is, an integral value of the concentration in the depth direction. In FIG. 39, thus, an amount of implantation to a P-type region 55 including the high-concentration P-RESURF layer 53 and the low-concentration P-RESURF layer 54 (that is, a sum of implantation amounts in two ion implantation steps of forming a P-RESURF layer) is set to about 1.2 to 2 times the RESURF condition.

If the implantation amount satisfies the conditions described in the first to third embodiments, the implantation layer may have a profile in any depth direction. In other words, the implantation layer may have a box profile uniform in the depth direction, may have a Gaussian distribution profile showing a gradual decrease in the depth direction, or may have a retrograde profile having a peak concentration at some depth.

The RESURF layers according to the first to fourth embodiments are formed through implantation of impurities, which may be formed through combination of epitaxial growth and etching. The effects of the present invention can be achieved by any manufacturing method as long as the final shape and the impurity concentration correspond to the conditions of implantation amounts described in the first to third embodiments.

While the first and third embodiments have described the examples in which the termination structure is formed through the photolithography process and impurity implantation process independent of each other, those processes may be shared with the steps of manufacturing an active region. This also holds true for the breakdown voltage structure according to the second embodiment.

For example, like a PIN diode 502 shown in FIG. 40, a high-concentration P-RESURF layer 56 is formed up to the region in which the P-base layer 2 according to the first embodiment is formed, whereby a P-base layer can be omitted, reducing manufacturing steps.

If the high-concentration P-RESURF layer is made to be 1.5 or more times the RESURF condition, the P-type impurity layer is not completely depleted on the normal use condition if the P-base layer is replaced with a high-concentration P-RESURF layer, and a punch-through to the anode electrode 5 does not occur. In this configuration, to lower the contact resistance with the anode electrode 5, a high-concentration P-type impurity layer having a small depth may be separately formed in a portion for contact with the anode electrode 5.

While the first to third embodiments limit the devices to which the present invention is applied to a PIN diode and a MOSFET, similar effects can be achieved if the present invention is applied as the termination structure and breakdown voltage structure of all types of devices including transistors such as an IGBT and a bipolar junction transistor (BJT), and thyristors.

The semiconductor substrate is not limited to silicon, and a semiconductor having a wide band gap, for example, a substrate formed of silicon carbide (SiC), gallium nitride (GaN)-based material, or diamond may be used. The optimum amount of implantation to the RESURF layer is determined mainly by a dielectric constant and a breakdown electric field of a semiconductor material used. The width of the optimum RESURF layer is determined mainly by a breakdown electric field of a semiconductor material and a breakdown voltage required. The present invention can effectively reduce an electric field inside a semiconductor, and thus, the width of the termination structure or breakdown voltage structure can be reduced compared with a conventional case.

A switching element and a diode element formed of such a wide band-gap semiconductor have high breakdown voltage resistance (voltage resistance) and high permissible current density, and thus can be miniaturized compared with silicon semiconductors. The use of the miniaturized switching elements and diode elements can miniaturize a semiconductor device module including those elements incorporated therein.

Those elements also have high heat resistance, and thus, a heat radiating fin of a heat sink can be miniaturized or can be cooled by air cooling rather than by water cooling but, which allows for further miniaturization of a semiconductor device module.

Any impurities such as boron (B), nitrogen (N), aluminum (Al), phosphorus (P), arsenic (As), and indium (In) may be used in implantation as long as they can be replaced with atoms of a semiconductor material for activation. At an interface between regions having different implantation amounts, for impurities having a larger diffusion length, an implantation amount (or concentration) changes more gently and an electric field the concentration is more relaxed. For this reason, an N-type semiconductor substrate, in which a P-type implantation layer is formed through implantation of boron (B) or aluminum (Al), is expected to produce better effects.

It is assumed in the first to fourth embodiments that 100% of the implanted impurities are activated. In a case where the activation rate is low or carriers are cancelled due to interface charges (positive interface charges for a P-type implantation layer or negative interface charges for an N-type implantation layer), an effective implantation amount decreases. In such a case, the effects of the present invention can be achieved by adding such a decrease amount to an implantation amount in the impurity implantation process.

In a case where an effective implantation amount increases due to interface charges (negative interface charges for a P-type implantation layer or positive interface charges for an N-type implantation layer), meanwhile, the effects of the present invention can be achieved by subtracting such an increase amount from the implantation amount in the impurity implantation process.

Lastly, the set of a low-concentration P-RESURF layer and a high-concentration P-RESURF layer included in the P-RESURF layer 3 will be commented. In the description above, for easy understanding of a change in implantation amount, the innermost high-concentration P-RESURF layer 7a is assumed as the set (referred to as set A) with a low-concentration P-RESURF layer whose width is zero, and the outermost low-concentration P-RESURF layer 11b is assumed as the set (referred to as set A) with a high-concentration P-RESURF layer whose width is zero. Likewise, the low-concentration P-RESURF layer 8b and the high-concentration P-RESURF layer 8a, the low-concentration P-RESURF layer 9b and the high-concentration P-RESURF layer 9a, and the low-concentration P-RESURF layer 10b and the high-concentration P-RESURF layer 10a are each assumed as a set (referred to as set A).

From another perspective, however, the high-concentration P-RESURF layer 7a and the low-concentration P-RESURF layer 8b, the high-concentration P-RESURF layer 8a and the low-concentration P-RESURF layer 9b, the high-concentration P-RESURF layer 9a and the low-concentration P-RESURF layer 10b, and the high-concentration P-RESURF layer 10a and the low-concentration P-RESURF layer 11b may be each taken as a set (referred to as set A'). While the number of sets reduces by one in this case, the widths of the sets A' are uniform, and a virtual implantation amount changes linearly, without any change. For the P-RESURF layer 3' of FIG. 6, the widths of the sets can be considered to be uniform as the sets A'. In the present invention, the set A and set A' may be each referred to as "a set of electric field relaxation layers".

While the invention has been shown and described in detail, the foregoing description is in all aspects illustrative and not restrictive. It is therefore understood that numerous modifications and variations can be devised without departing from the scope of the invention.

The invention claimed is:

1. A semiconductor device comprising:
   an active region formed in an upper layer portion of a semiconductor layer of a first conductivity type; and
   a plurality of electric field relaxation layers disposed from an edge of said active region toward the outside so as to surround said active region, wherein
   said plurality of electric field relaxation layers include a plurality of first electric field relaxation layers and a plurality of second electric field relaxation layers alternately disposed adjacent to each other, said first electric field relaxation layer and said second electric field relaxation layer adjacent to each other forming a set,
   impurities of a second conductivity type are implanted to said first electric field relaxation layers at a first surface density, widths of said first electric field relaxation layers becoming smaller with increasing distance from said active region,
   impurities of the second conductivity type are implanted to said second electric field relaxation layers at a second surface density lower than said first surface density, widths of said second electric field relaxation layers becoming larger with increasing distance from said active region,
   said plurality of electric field relaxation layers are disposed in order of said first electric field relaxation layer and said second electric field relaxation layer from said active region side,
   said active region being a first main electrode layer of the second conductivity type,
   said semiconductor device further comprising:
   a second main electrode layer of the second conductivity type formed, in a main surface of said semiconductor layer on the side on which said active region is provided, apart from said active region;

a well layer of the first conductivity type formed so as to surround said second main electrode layer;
a gate insulating film formed from above an edge on said first main electrode layer side of said second main electrode layer to above said well layer on the first main electrode layer side; and
a gate electrode formed on said gate insulating film, wherein
said plurality of electric field relaxation layers are disposed between said first main electrode layer and said well layer, and
said first main electrode layer, said second main electrode layer, said well layer, and said gate electrode form a lateral MOS transistor in which main current flows between said first main electrode layer and said second main electrode layer through said plurality of electric field relaxation layers.

2. A semiconductor device comprising:
an active region formed in an upper layer portion of a semiconductor layer of a first conductivity type; and
a plurality of electric field relaxation layers disposed from an edge of said active region toward the outside so as to surround said active region, wherein
said plurality of electric field relaxation layers include a plurality of first electric field relaxation layers and a plurality of second electric field relaxation layers alternately disposed adjacent to each other, said first electric field relaxation layer and said second electric field relaxation layer adjacent to each other forming a set,
impurities of a second conductivity type are implanted to said first electric field relaxation layers at a first surface density, widths of said first electric field relaxation layers becoming smaller with increasing distance from said active region,
impurities of the second conductivity type are implanted to said second electric field relaxation layers at a second surface density lower than said first surface density, widths of said second electric field relaxation layers becoming larger with increasing distance from said active region, and
said plurality of electric field relaxation layers are disposed in order of said first electric field relaxation layer and said second electric field relaxation layer from said active region side,
a plurality of additional electric field relaxation layers provided so as to surround said plurality of electric field relaxation layers, wherein
said plurality of additional electric field relaxation layers include a plurality of non-implantation regions, to which impurities of the second conductivity type are not implanted, and a plurality of third electric field relaxation layers having the same conductivity type and the same surface density as those of said second electric field relaxation layers, said plurality of non-implantation regions and said plurality of third electric field relaxation layers being alternately disposed adjacent to each other, each of said non-implantation regions and each of said third electric field relaxation layers adjacent to each other forming a set,
said third electric field relaxation layers have widths becoming smaller as apart from said active region,
said non-implantation regions have widths becoming larger as apart from said active region, and
said plurality of additional electric field relaxation layers are disposed in order of said non-implantation region and said third electric field relaxation layer from said active region side.

3. The semiconductor device according to claim 2, wherein in said plurality of additional electric field relaxation layers, a change amount by which the widths of said third electric field relaxation layers become smaller coincides with a change amount by which the widths of said non-implantation regions become larger.

4. The semiconductor device according to claim 2, wherein
said active region is a Schottky region that forms a Schottky junction with a Schottky electrode, and
said Schottky electrode and said Schottky region form a Schottky barrier diode.

5. The semiconductor device according to claim 4, wherein said first electric field relaxation layer closest to said active region among said plurality of electric field relaxation layers is formed to extend up to a portion below an end of said Schottky electrode.

6. The semiconductor device according to claim 2, wherein
said active region is an impurity layer of the second conductivity type, and
said impurity layer has the same conductivity type and the same surface density as those of said first electric field relaxation layers.

7. The semiconductor device according to claim 2, wherein
said second surface density is 0.6 to 0.9 times RESURF condition determined by a material of said semiconductor layer, and
said first surface density is 1.5 to 2.5 times said second surface density.

8. The semiconductor device according to claim 2, wherein in said plurality of additional electric field relaxation layers, all sets have the same total width of said non-implantation region and said third electric field relaxation layer that form a set.

9. A method of manufacturing said semiconductor device according to claim 2, comprising the steps of:
(a) forming a first implantation mask on said semiconductor layer and ion-implanting impurities of the second conductivity type at said second surface density to form an impurity layer identical to said second electric field relaxation layers so as to extend in regions in which said first electric field relaxation layers are formed, and forming said third electric field relaxation layers to define said non-implantation regions; and
(b) after said step (a), forming on said semiconductor layer, a second implantation mask that covers at least portions located above regions to serve as said second electric field relaxation layers, portions located above said third electric field relaxation layers, and portions located above said non-implantation regions, and ion-implanting impurities of the second conductivity type at a surface density that becomes said first surface density through addition to said second surface density, to thereby form said first electric field relaxation layers.

10. A method of manufacturing a semiconductor device, comprising:
an active region formed in an upper layer portion of a semiconductor layer of a first conductivity type; and
a plurality of annular electric field relaxation layers disposed from an edge of said active region toward the outside so as to surround said active region, wherein
said plurality of electric field relaxation layers include a plurality of first electric field relaxation layers and a plurality of second electric field relaxation layers alternately disposed adjacent to each other, said first electric field relaxation layer and said second electric field relaxation layer adjacent to each other forming a set, impurities of a second conductivity type are implanted to said first electric field relaxation lavers at a first surface density, widths of each successive of said first electric field relaxation layers becoming smaller with increasing distance from said active region, impurities of the second conductivity type are implanted to said second electric field relaxation layers at a second surface density lower than said first surface density, widths of each successive of said second electric field relaxation layers becoming larger with increasing distance from said active region, and said plurality of electric field relaxation layers are disposed in order of said first electric field relaxation layer and said second electric field relaxation layer from said active region side, the method comprising the steps of:
(a) forming a first implantation mask on said semiconductor layer, and ion-implanting impurities of the second conductivity type at said second surface density, to thereby form an impurity layer identical to said second electric field relaxation layers so as to extend in regions in which said first electric field relaxation layers are formed; and
(b) after said step (a), forming on said semiconductor layer, a second implantation mask that covers at least portions located above regions to serve as said second electric field relaxation layers, and ion-implanting impurities of the second conductivity type at a surface density that becomes said first surface density through addition to said second surface density, to thereby form said first electric field relaxation layers.

* * * * *

UNITED STATES PATENT AND TRADEMARK OFFICE
CERTIFICATE OF CORRECTION

PATENT NO. : 9,536,942 B2
APPLICATION NO. : 14/363914
DATED : January 3, 2017
INVENTOR(S) : Tsuyoshi Kawakami et al.

It is certified that error appears in the above-identified patent and that said Letters Patent is hereby corrected as shown below:

On the Title Page

Item (30), the Foreign Application Priority Data Information is incorrect. Item (30) should read:

-- (30) Foreign Application Priority Data
Mar. 16, 2012   (JP)..........................2012-059899 --

Signed and Sealed this
Twenty-eighth Day of November, 2017

Joseph Matal
*Performing the Functions and Duties of the*
*Under Secretary of Commerce for Intellectual Property and*
*Director of the United States Patent and Trademark Office*